(12) United States Patent
Kao et al.

(10) Patent No.: US 12,176,349 B2
(45) Date of Patent: Dec. 24, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Wan-Yi Kao, Baoshan Township (TW); Hung Cheng Lin, Hsinchu (TW); Chunyao Wang, Zhubei (TW); Yung-Cheng Lu, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/335,637

(22) Filed: Jun. 15, 2023

(65) Prior Publication Data

US 2023/0326927 A1 Oct. 12, 2023

Related U.S. Application Data

(62) Division of application No. 17/157,182, filed on Jan. 25, 2021, now Pat. No. 11,764,221.

(60) Provisional application No. 63/058,654, filed on Jul. 30, 2020.

(51) Int. Cl.
H01L 27/092 (2006.01)
H01L 21/8234 (2006.01)
H01L 29/66 (2006.01)
H01L 29/78 (2006.01)

(52) U.S. Cl.
CPC .......... *H01L 27/0924* (2013.01); *H01L 21/823431* (2013.01); *H01L 29/66795* (2013.01); *H01L 29/7851* (2013.01)

(58) Field of Classification Search
CPC ......... H01L 27/0924; H01L 21/823431; H01L 29/66795; H01L 29/7851
See application file for complete search history.

(56) References Cited

U.S. PATENT DOCUMENTS

| | | | |
|---|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |

(Continued)

FOREIGN PATENT DOCUMENTS

| | | |
|---|---|---|
| CN | 111211088 A | 5/2020 |
| KR | 20110104432 A | 9/2011 |

(Continued)

*Primary Examiner* — Christine A Enad
(74) *Attorney, Agent, or Firm* — Slater Matsil, LLP

(57) ABSTRACT

A semiconductor device and method of manufacture are provided. In embodiments a dielectric fin is formed in order to help isolate adjacent semiconductor fins. The dielectric fin is formed using a deposition process in which deposition times and temperatures are utilized to increase the resistance of the dielectric fin to subsequent etching processes.

20 Claims, 27 Drawing Sheets

(56) References Cited

U.S. PATENT DOCUMENTS

| | | |
|---|---|---|
| 9,608,116 B2 | 3/2017 | Ching et al. |
| 9,754,798 B1 | 9/2017 | Bi et al. |
| 9,812,363 B1 | 11/2017 | Liao et al. |
| 9,859,380 B2 | 1/2018 | Lee et al. |
| 10,236,220 B1 | 3/2019 | Chang et al. |
| 2008/0296650 A1 | 12/2008 | Ahn et al. |
| 2010/0072553 A1 | 3/2010 | Xu et al. |
| 2011/0230057 A1 | 9/2011 | Takasawa et al. |
| 2015/0232986 A1 | 8/2015 | Kameda et al. |
| 2016/0043225 A1 | 2/2016 | Ching et al. |
| 2016/0336237 A1 | 11/2016 | Lee et al. |
| 2017/0125305 A1 | 5/2017 | Zhou |
| 2017/0133487 A1 | 5/2017 | Chiang et al. |
| 2017/0338225 A1 | 11/2017 | Ching et al. |
| 2018/0061717 A1 | 3/2018 | Wang et al. |
| 2018/0166352 A1 | 6/2018 | Choi et al. |
| 2019/0035786 A1 | 1/2019 | Huang et al. |
| 2019/0067417 A1 | 2/2019 | Ching et al. |
| 2019/0103304 A1 | 4/2019 | Lin et al. |
| 2019/0221717 A1 | 7/2019 | Lim et al. |
| 2019/0355823 A1 | 11/2019 | Lin et al. |
| 2020/0075342 A1* | 3/2020 | Chen .................. H01L 21/31144 |
| 2020/0083222 A1* | 3/2020 | Kim .................... H01L 27/0924 |
| 2020/0105583 A1 | 4/2020 | Wang et al. |

FOREIGN PATENT DOCUMENTS

| | | |
|---|---|---|
| KR | 20150097413 A | 8/2015 |
| KR | 20190024530 A | 3/2019 |
| TW | 201715615 A | 5/2017 |

* cited by examiner

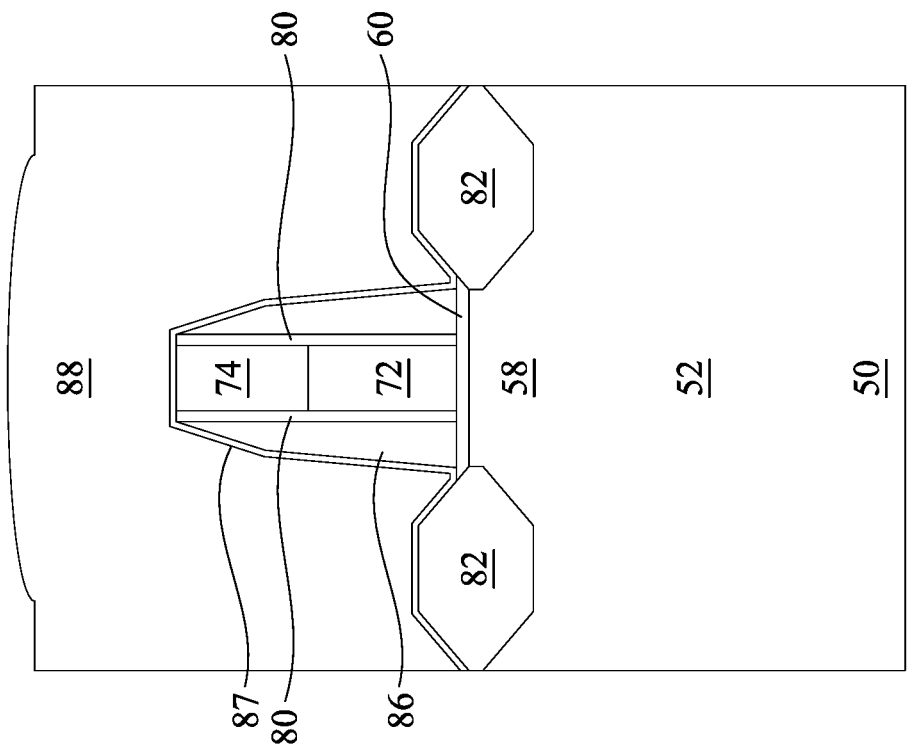
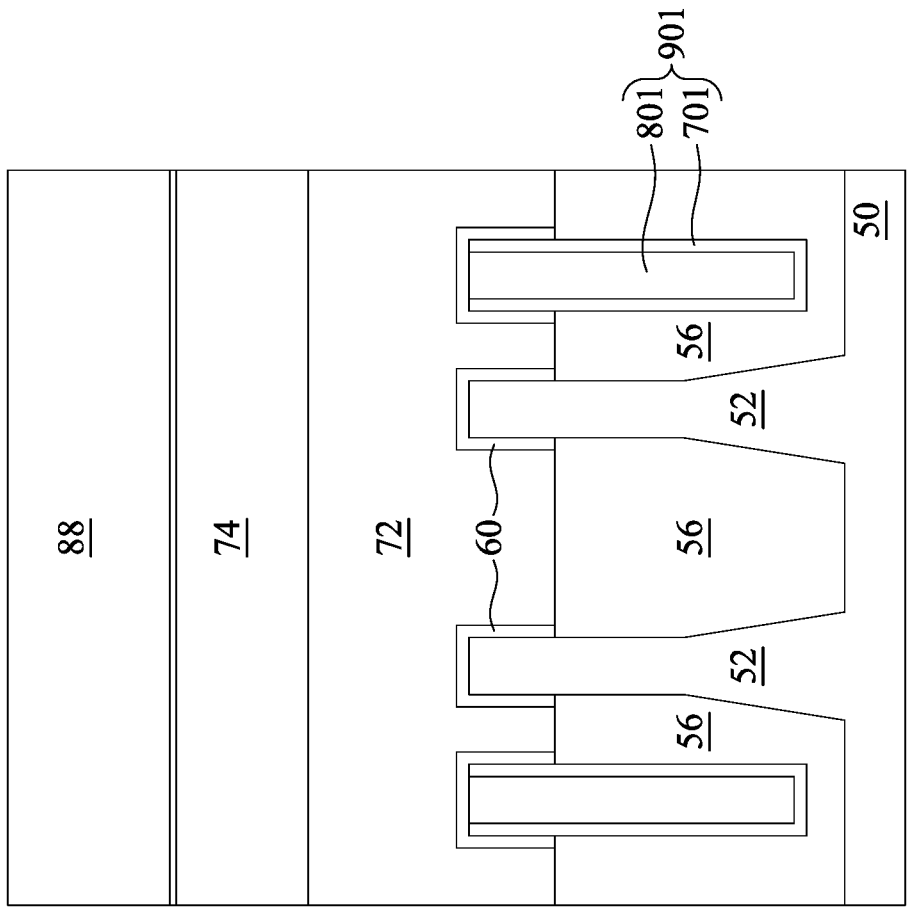
Fig. 15B
Fig. 15A

SEMICONDUCTOR DEVICE AND METHOD OF MANUFACTURE

PRIORITY CLAIM AND CROSS-REFERENCE

This application is a divisional of U.S. patent application Ser. No. 17/157,182 filed on Jan. 25, 2021, entitled "Semiconductor Device and Method of Manufacture," which claims the benefit of U.S. Provisional Application No. 63/058,654, filed on Jul. 30, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7A, 7B, 7C, 7D, 7E, 8A, 8B, 9, 10, 11, 12A, 12B, 13A, 13B, 14A, 14B, 14C, 14D, 15A, 15B, 16A, 16B, 17A, 17B, 18A, 18B, 18C, 19A, 19B, 20A, 20B, 21A, and 21B are cross-sectional views of intermediate stages in the manufacturing of FinFETs, in accordance with some embodiments.

DETAILED DESCRIPTION

Figure 1:
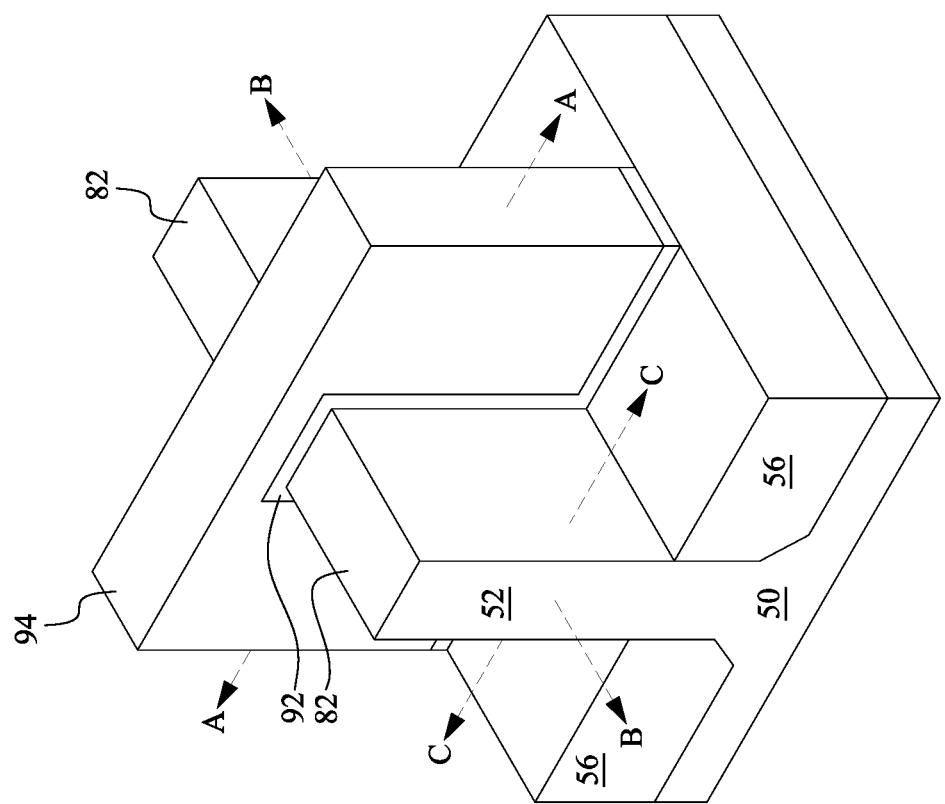
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment in which a hybrid dielectric fin is formed within an isolation region. The embodiments describe herein, however, are not intended to be limited to the precise embodiments described, and the ideas may be implemented in a wide variety of uses. All such uses are fully intended to be included within the scope of the embodiments.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 20B are cross-sectional views of intermediate stages in the manufacturing of FinFETs, in accordance with some embodiments. FIGS. 2 through 7A and 8A-11 illustrate reference cross-section A-A illustrated in FIG. 1, except for multiple fins/FinFETs. FIGS. 12A, 13A, 14A, 15A, 16A, 17A, 18A, 19A, and 20A are illustrated along reference cross-section A-A illustrated in FIG. 1, and FIGS. 12B, 13B, 14B, 15B, 16B, 17B, 18B, 18C, 19B, and 20B are illustrated along a similar cross-section B-B illustrated in FIG. 1, except for multiple fins/FinFETs. FIGS. 14C and 14D are illustrated along reference cross-section C-C illustrated in FIG. 1, except for multiple fins/FinFETs.

Figure 2:
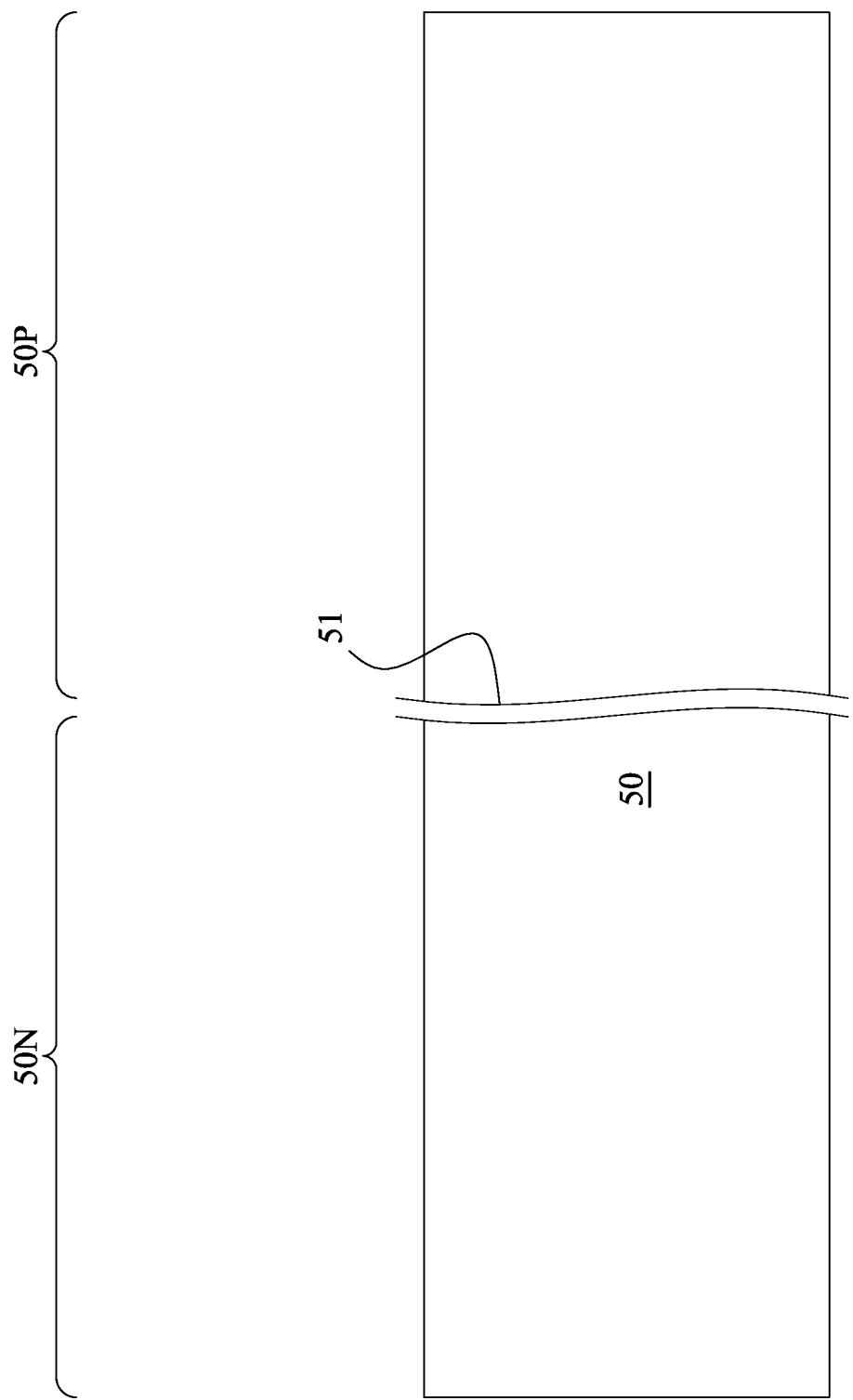

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
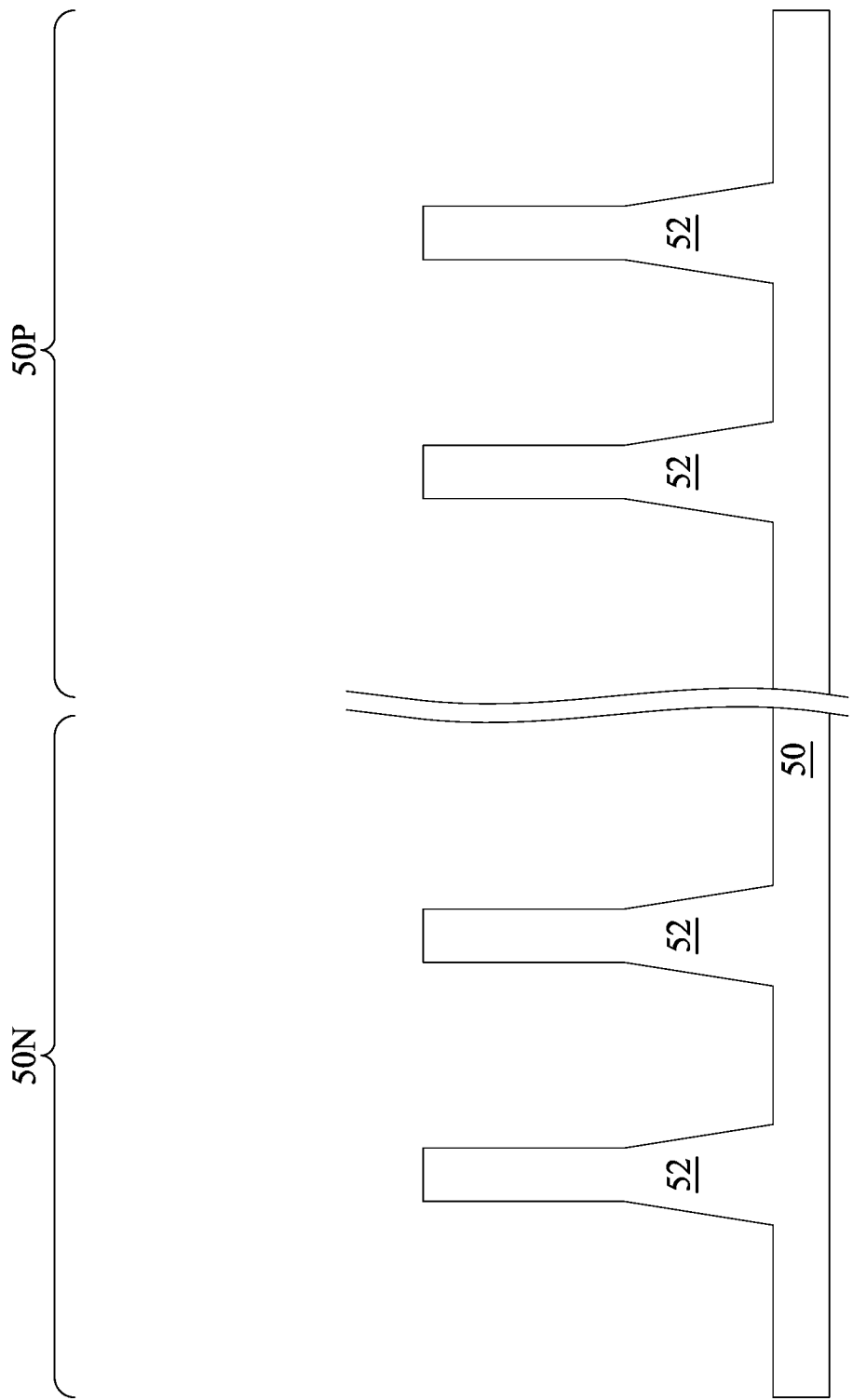

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch process may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
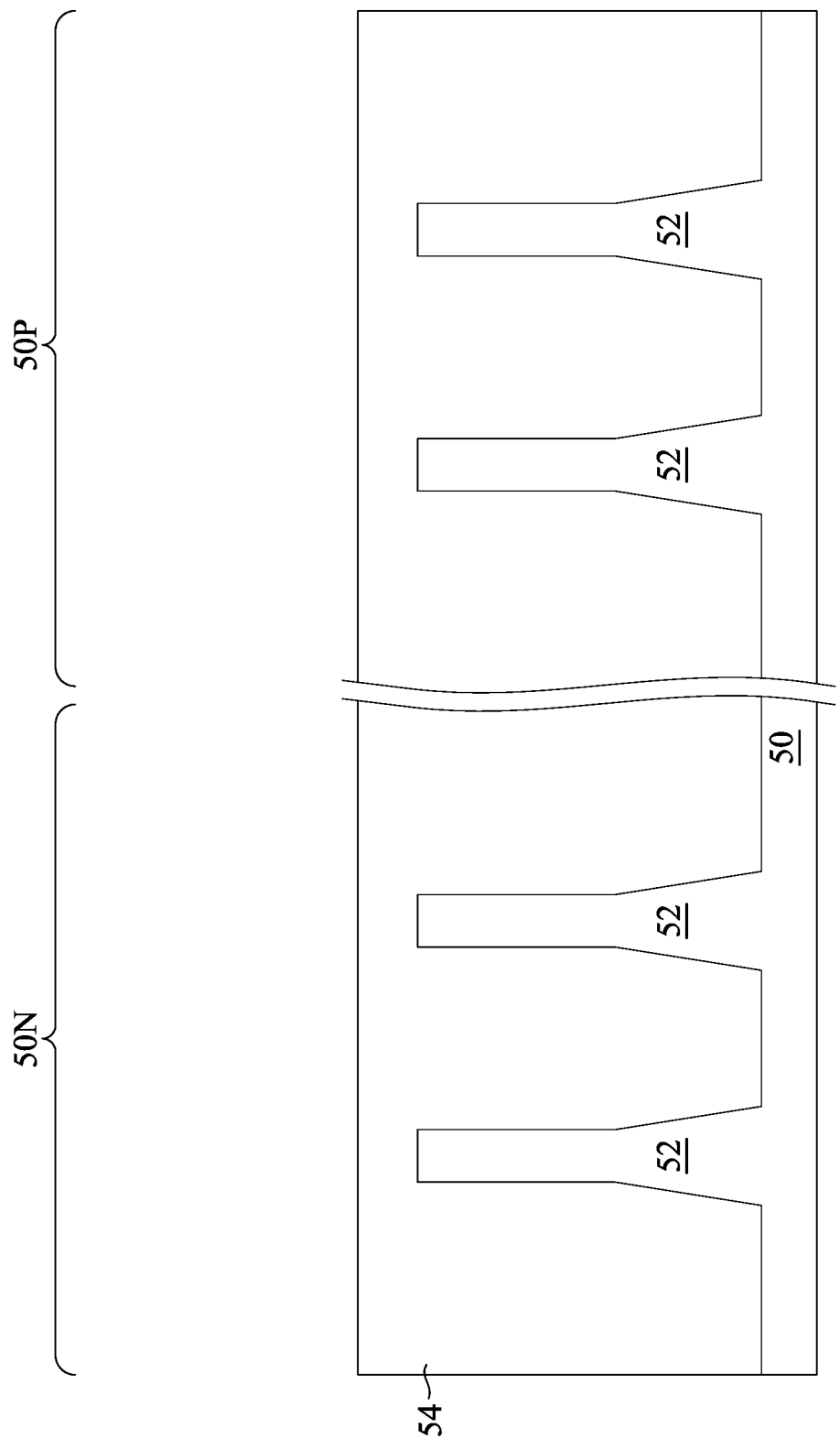

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
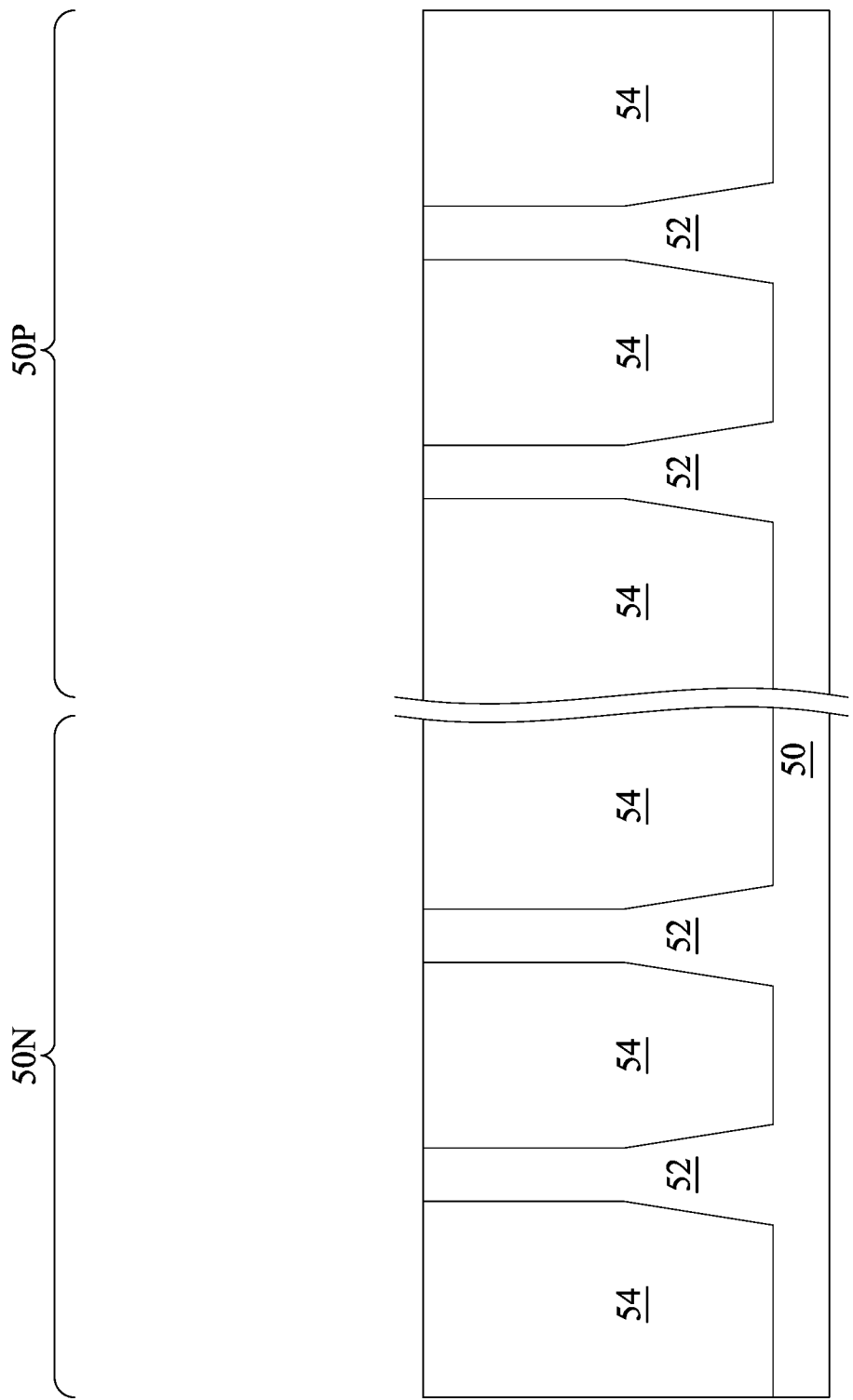

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
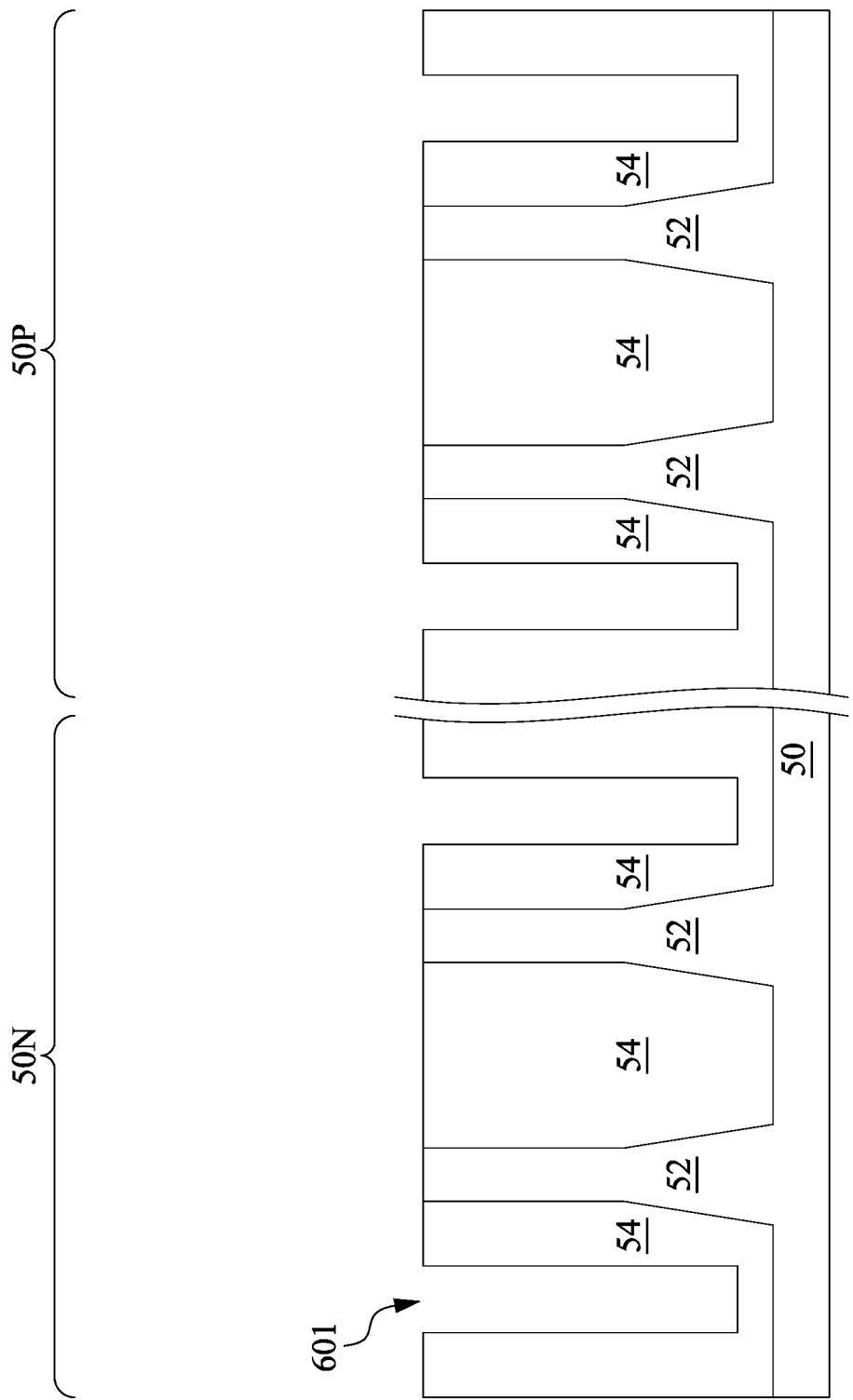

FIG. 6 illustrates a removal process which forms first openings 601 to begin a process for forming dielectric hybrid fins 901 (not illustrated in FIG. 6 but illustrated and described below with respect to FIG. 9). In an embodiment the first openings 601 may be formed using one or more suitable photolithographic masking and etching processes. Additionally, any suitable dimensions may be utilized.

Figure 7A:
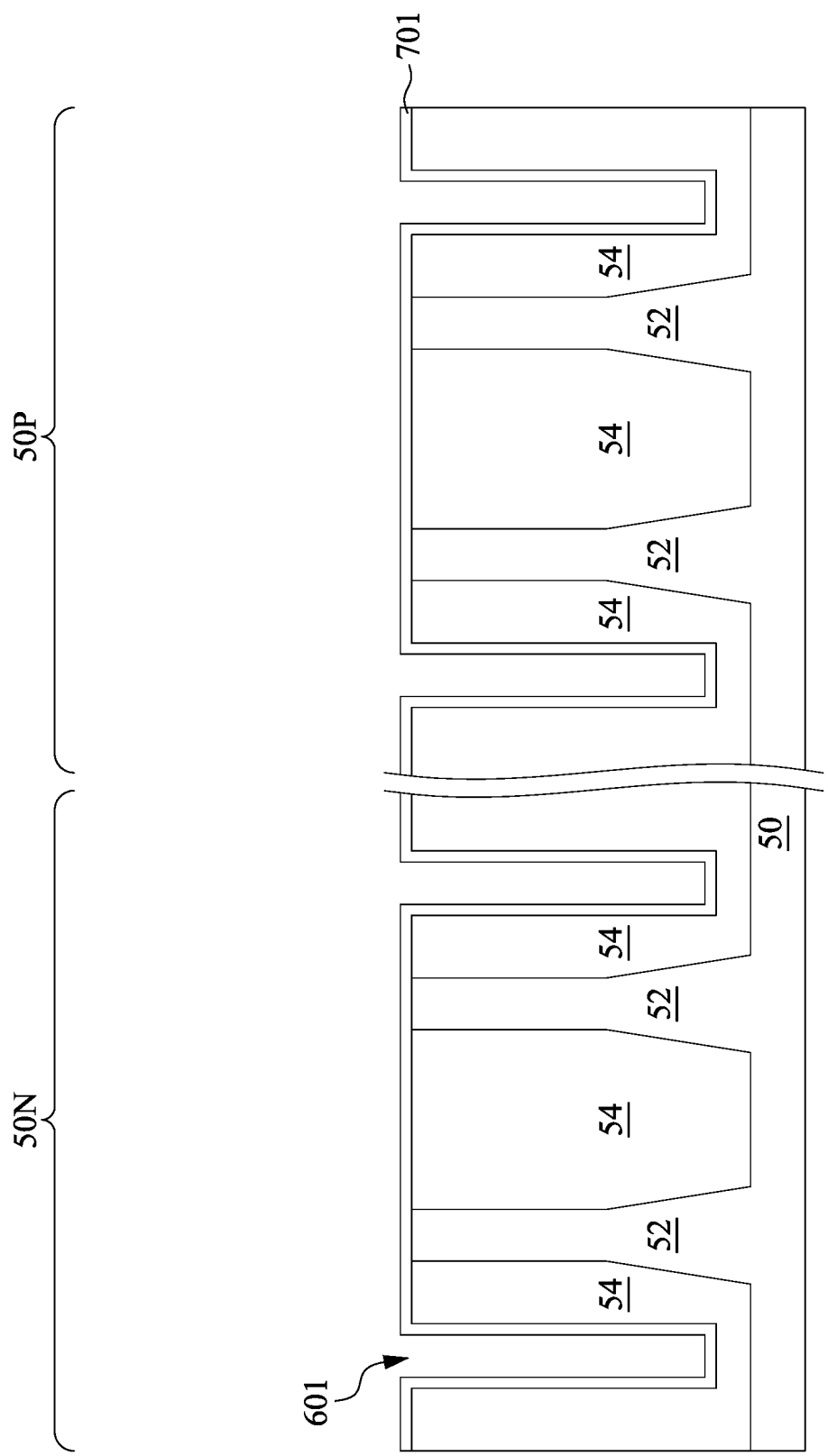
Figure 7B:
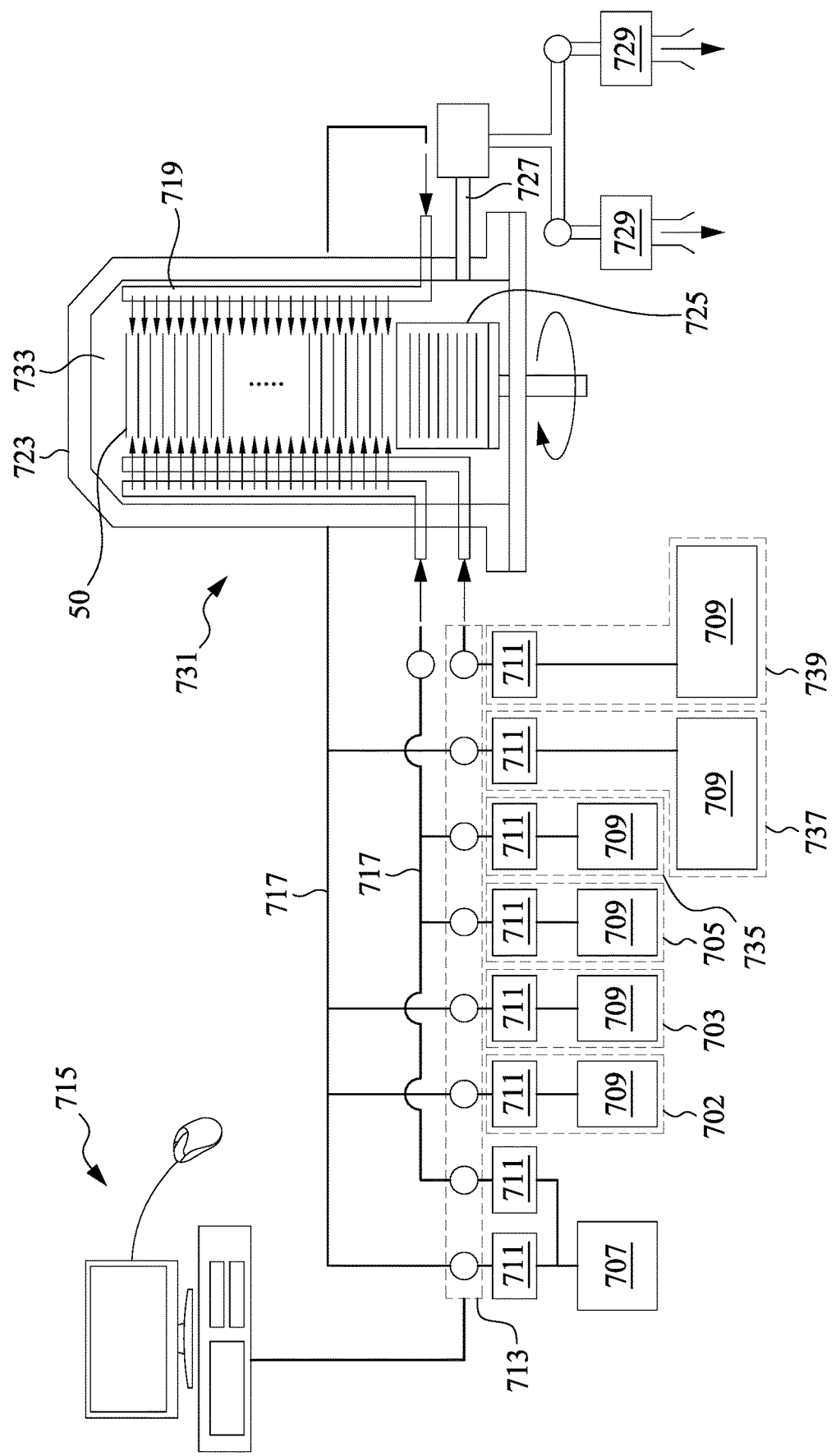

FIGS. 7A-7B illustrate a formation of a blocking layer 701 to line the first openings 601. In an embodiment the blocking layer 701 may be a dielectric material which helps to isolate a subsequently formed material (e.g., a bulk material 801) from the insulation material 54. For example, in some embodiments the blocking layer 701 may be a dielectric material such as silicon carbon nitride (SiCN) or the like, however, any suitable material may be utilized.

FIG. 7B illustrates a deposition system 731 which may be utilized to receive precursor materials in order to help deposit the blocking layer 701. In an embodiment the deposition system 731 receives precursor materials from a plurality of precursor delivery systems, such as a first precursor delivery system 702, a second precursor delivery system 703, and a third precursor delivery system 705 and form layers of materials onto the substrate 50 within a deposition chamber 733.

In an embodiment the first precursor delivery system 702, the second precursor delivery system 703, and the third precursor delivery system 705 may work in conjunction with one another to supply the one or more different precursor materials to the deposition chamber 733 wherein one or more of the substrates 50 are placed. However, the first precursor delivery system 702, the second precursor delivery system 703, and the third precursor delivery system 705 may have physical components that are similar with each other. For example, the first precursor delivery system 702, the second precursor delivery system 703, and the third precursor delivery system 705 may each include a gas supply 709 and a flow controller 711. In an embodiment in which the first precursor is stored in a gaseous state, the gas supply 709 may supply the first precursor to the deposition chamber 733. The gas supply 709 may be a vessel, such as a gas storage tank, that is located either locally to the deposition chamber 733 or else may be located remotely from the deposition chamber 733. Alternatively, the gas supply 709 may be a facility that independently prepares and delivers the first precursor to the flow controller 711. Any suitable source for the first precursor may be utilized as the gas supply 709, and all such sources are fully intended to be included within the scope of the embodiments.

The gas supply 709 may supply the desired precursor to the flow controller 711. The flow controller 711 may be utilized to control the flow of the precursor to one or more precursor gas controllers 713 and, eventually, to the deposition chamber 733, thereby also helping to control the pressure within the deposition chamber 733. The flow controller 711 may be, e.g., a proportional valve, a modulating valve, a needle valve, a pressure regulator, a mass flow controller, a liquid source controller vaporizer, combinations of these, or the like. However, any suitable method for controlling and regulating the flow of the first precursor may be utilized, and all such components and methods are fully intended to be included within the scope of the embodiments.

Additionally, in an embodiment in which the first precursor is stored in a solid or liquid state, the gas supply 709 may store a carrier gas and the carrier gas may be introduced into a precursor canister, which stores the first precursor in the solid or liquid state. The carrier gas is then used to push and carry the first precursor as it either evaporates or sublimates into a gaseous section of the precursor canister before being sent to the precursor gas controller 713. Any suitable method and combination of units may be utilized to provide the first precursor, and all such combination of units is fully intended to be included within the scope of the embodiments.

The first precursor delivery system 702, the second precursor delivery system 703, and the third precursor delivery system 705 may supply their individual precursor materials into one or more of a series of precursor gas controllers 713. The precursor gas controllers 713 connect and isolate the first precursor delivery system 702, the second precursor delivery system 703, and the third precursor delivery system 705 from the deposition chamber 733 in order to deliver the desired precursor materials to the deposition chamber 733. The precursor gas controller 713 may include such devices as valves, flow meters, sensors, or the like to control the delivery rates of each of the precursors and may be controlled by instructions received from a control unit 715.

The precursor gas controllers 713, upon receiving instructions from the control unit 715, may open and close valves so as to connect one or more of the first precursor delivery system 702, the second precursor delivery system 703, and the third precursor delivery system 705 to the deposition chamber 733 and direct a desired precursor material through one or more manifolds 717, into the deposition chamber 733, and to one or more injection units 719. The injection units 719 may be utilized to disperse the chosen precursor material(s) into the deposition chamber 733 and may be designed to evenly disperse the precursor material in order to minimize undesired process conditions that may arise from uneven dispersal. In a particular embodiment the injection units 719 may be formed, for example, from coiled tubing including a plurality of holes distributed throughout the tubing allowing for uniform dispersal of the precursor material in the deposition chamber 733. However, any suitable shape may be utilized.

However, as one of ordinary skill in the art will recognize, the introduction of precursor materials to the deposition chamber 733 through a single unit as described above is intended to be illustrative only and is not intended to be limiting to the embodiments. Any number of separate and independent injectors, such as three separate and independent injectors, or other openings to introduce precursor materials into the deposition chamber 733 may alternatively be utilized. All such combinations and other points of introduction are fully intended to be included within the scope of the embodiments.

The deposition chamber 733 may receive the desired precursor materials and expose the precursor materials to the substrates 50, and the deposition chamber 733 may be any desired shape that may be suitable for dispersing the precursor materials and contacting the precursor materials with the substrates 50. In the embodiment illustrated in FIG. 7B, the deposition chamber 733 has a cylindrical sidewall and a bottom. However, the deposition chamber 733 is not limited to a cylindrical shape, and any other suitable shape, such as a hollow square tube, an octagonal shape, or the like, may be utilized. Furthermore, the deposition chamber 733 may be surrounded by a housing 723 made of material that is inert to the various process materials. As such, while the housing 723 may be any suitable material that can withstand the chemistries and pressures involved in the deposition process, in an embodiment the housing 723 may be steel, stainless steel, nickel, aluminum, alloys of these, combinations of these, and like.

Within the deposition chamber 733 a plurality of the substrates 50 may be placed within a rack on a mounting rack 725 in order to position and control the substrates 50 during the deposition processes. The mounting rack 725 may include heating mechanisms in order to heat the substrates 50 during the deposition processes. Furthermore, while a mounting rack 725 is illustrated in FIG. 7B, a single mounting platform for supporting a single wafer may be included within the deposition chamber 733.

In addition, the deposition chamber 733 may include heating elements and/or heating lamps configured to control the temperatures of precursor gases (e.g., the first precursor) entering the deposition chamber 733 and the exhaust gases exiting the deposition chamber 733. According to embodiments, as the precursors enter the manifold 717 the heating elements either maintain or else raise the temperature of the precursors to a process temperature above a boiling point of the precursors to ensure that the precursor remains in a gas-phase and maintain a suitable flow rate of the precursors at the injection unit 719. Furthermore, as the exhaust gases are evacuated from the deposition chamber 733, the heating elements maintain or raise the temperature of the exhaust gases at the exhaust outlet 727 to a temperature above a boiling point of the exhaust gases to maintain a suitable evacuation rate of the exhaust.

The deposition chamber 733 further comprises cooling elements and a coolant source, according to some embodiments. The cooling elements are located within the housing 723 adjacent the injection unit 719 and the mounting rack 725. The control unit 715 controls the valve at the coolant source to release coolant into the cooling elements. As such, the temperatures of the precursor gases are controlled to a desired process temperature as they exit the injection unit 719 and at the locations of the substrates 50 during the deposition process.

One or more vacuum pumps 729 (e.g., two vacuum pumps 729, one for one precursor such as DCS, and another for the other precursors such as ammonia and propane) may be connected to an exhaust outlet 727 of the deposition chamber 733 in order to help evacuate the exhaust gases. The exhaust outlet 727, under control of the control unit 715, may also be utilized to reduce and control the pressure within the deposition chamber 733 to a desired pressure and may also be utilized to evacuate precursor materials from the deposition chamber 733 in preparation for the introduction of the next precursor material.

The control unit 715 may be utilized to control the precursor gas controller 713, the vacuum pump 729, the heating elements, the coolant source, and/or the cooling elements. The control unit 715 may be any form of computer processor that can be used in an industrial setting for controlling process machines. In an embodiment the control unit 715 may comprise a processing unit, such as a desktop computer, a workstation, a laptop computer, or a dedicated unit customized for a particular application. The control unit 715 may be equipped with a display and one or more input/output components, such as instruction outputs, sensor inputs, a mouse, a keyboard, printer, combinations of these, or the like. The processing unit may include a central processing unit (CPU), memory, a mass storage device, a video adapter, an I/O interface, and/or a network interface connected to a bus.

The bus may be one or more of any type of several bus architectures including a memory bus or memory controller, a peripheral bus, or video bus. The CPU may comprise any type of electronic data processor, and the memory may comprise any type of system memory, such as static random access memory (SRAM), dynamic random access memory (DRAM), or read-only memory (ROM). The mass storage device may comprise any type of storage device configured to store data, programs, and other information and to make the data, programs, and other information accessible via the bus. The mass storage device may comprise, for example, one or more of a hard disk drive, a magnetic disk drive, or an optical disk drive.

The video adapter and the I/O interface provide interfaces to couple external input and output devices to the processing unit. Examples of input and output devices include, but are not limited to, the display coupled to the video adapter and the I/O component, such as a mouse, keyboard, printer, or the like, coupled to the I/O interface. Other devices may be coupled to the processing unit and additional or fewer interface cards may be utilized. For example, a serial interface card (not shown) may be used to provide a serial interface for a printer.

The network interface couples the processing unit to external networks to facilitate network communications and to provide network access to external resources via one or more wired and/or wireless links (e.g., local area network (LAN) and/or wide area network (WAN)). The network access and network communications may use one or more circuit switched networks and/or packet switched networks. In an embodiment the control unit 715 may be a system that is locally connected via one or more wired and/or wireless connections to the precursor gas controllers 713 and/or the vacuum pumps 729. In another embodiment the control unit 715 may be a system that is remote from the precursor gas controller 713 and/or the vacuum pump 729, and may connect and control the precursor gas controller 713 and vacuum pump 729 via a remote wired and/or wireless connection. In an embodiment, the control unit 715 may be a distributed system comprising one or more processing units of one or more network servers and/or may employ one or more network services for controlling the precursor gas controller 713 and/or the vacuum pump 729.

It should be noted that the control unit 715 may include other components. For example, the control unit 715 may include power supplies, cables, a motherboard, removable storage media, cases, or the like. These other components, although not shown in FIG. 7B, are considered part of the control unit 715.

Additionally, the deposition system 731 may also comprise additional structures which may be utilized for other deposition processes, allowing multiple deposition processes to be performed in the same chamber. For example, in some embodiments the deposition system 731 may comprise additional precursor delivery systems such as a fourth precursor delivery system 735 (with a precursor such as oxygen), a fifth precursor delivery system 737 (with a precursor such as hexachlorodisilane (HCD)), and a sixth precursor delivery system 739 (with a precursor such as triethylamine). Any suitable delivery system, with any suitable number of precursor delivery systems, may be utilized.

To begin the deposition process, a first precursor material may be placed into one or more of the first precursor delivery system 702, the second precursor delivery system 703, and/or the third precursor delivery system 705. In an embodiment in which the blocking layer 701 is silicon carbon nitride (SiCN), the first precursor material may be a silicon comprising precursor such as dichlorosilane (DCS) or the like. However, any suitable precursor for any suitable material may be utilized.

A second precursor material may be placed into another one of the first precursor delivery system 702, the second precursor delivery system 703, and/or the third precursor delivery system 705. In the embodiment in which the blocking layer 701 is silicon carbon nitride (SiCN) and the first precursor material is dichlorosilane, the second precursor material may be a carbon comprising precursor such as propane ($C_3H_6$) or the like. However, any suitable precursor for any suitable material may be utilized.

A third precursor material may be placed into yet another one of the first precursor delivery system 702, the second precursor delivery system 703, and/or the third precursor delivery system 705. In the embodiment in which the blocking layer 701 is silicon carbon nitride (SiCN), the first precursor material is dichlorosilane, and the second precursor material is propane, the third precursor material may be a nitrogen containing precursor such as ammonia ($NH_3$) or the like. However, any suitable precursor for any suitable material may be utilized.

Once the first precursor material, the second precursor material, and the third precursor material have been placed into the first precursor delivery system 702, the second precursor delivery system 703, and the third precursor delivery system 705, respectively, the formation of the blocking layer 701 may be initiated by placing one or more of the substrates 50 (e.g., 100 substrates 50) into the mounting rack 725 (e.g., a wafer boat) and then raising the mounting rack 725 into the deposition chamber 733.

Once the mounting rack 725 has been placed, a pressure within the deposition chamber 733 may be adjusted to the desired process pressures. In an embodiment the pressure may be adjusted to be about 4660 Pa. Additionally, the temperature within the deposition chamber 733 may be ramped up to the desired process temperature, such as ramping the temperature to the desired process temperature of between about 500° C. and about 700° C., such as about 620° C., 640° C. or 680° C. In a very particular embodiment the process temperature may be ramped up from a temperature of about 300° C. to a process temperature of about 640° C. However, any suitable process conditions may be utilized.

Then, after a leak check, an optional pre-purge may be performed. In an embodiment the pre-purge may be performed by introducing one or more of the first precursor material, the second precursor material, or the third precursor material to the deposition chamber 733 prior to the start of an atomic layer deposition cycle (discussed further below). For example, in the embodiment in which the blocking layer 701 is silicon carbon nitride formed using ammonia as the third precursor material, the pre-purge may be performed by introducing the third precursor material into the deposition chamber 733 at any suitable flow rate and times may be utilized.

Once the pre-purge (if present) has been completed, the atomic layer deposition cycle may be initiated by the control unit 715 sending an instruction to the precursor gas controller 713 to connect the first precursor delivery system 702 to the deposition chamber 733. Once connected, the first precursor delivery system 702 can deliver the first precursor material to the injection unit 719 through the precursor gas controller 713 and the manifold 717. The injection unit 719 can then disperse the first precursor material into the deposition chamber 733, wherein the first precursor material can be adsorbed and react with each of the exposed surfaces.

In one embodiment in which the blocking layer 701 is silicon carbon nitride, the first precursor material (e.g., DCS) may be flowed into the deposition chamber 733 at any suitable flow rate with a carrier gas introduced at any suitable flow rate. Additionally, the substrates 50 may be rotated in order to help ensure a uniform flow across the substrates 50. However, any suitable flow rate may be utilized.

Additionally, in order to better control the composition of the individual elements within the blocking layer 701, the time which the first precursor material is pulsed into the deposition chamber 733 is controlled. For example, in one embodiment the first precursor material may be pulsed for a first time of between about 3 seconds and about 20 seconds, such as about 12 seconds. However, any suitable time may be utilized.

Figure 7E:
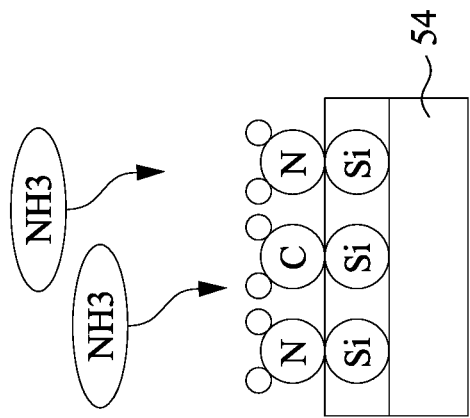
Figure 7D:
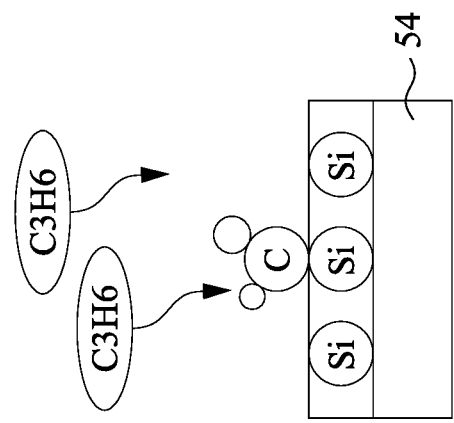
Figure 7C:
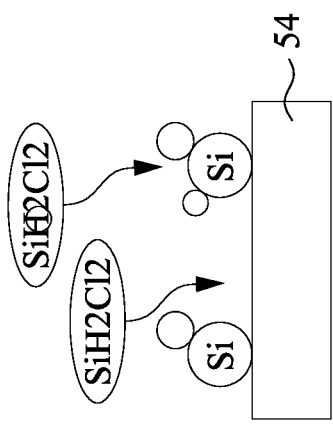

FIG. 7C illustrates a close-up view of a surface of the insulation material 54 and illustrates that, in the embodiment in which a layer of silicon carbon nitride is desired to be formed using dichlorosilane, under these process conditions the dichlorosilane will react with the exposed surfaces (e.g., the insulation material 54) in order to provide a surface wherein silicon is chemically bonded to the underlying surface while the opposite surface is terminated with hydrogen atoms and chlorine atoms which are exposed to the ambient atmosphere within the deposition chamber 733. Additionally, the reaction of the dichlorosilane with the underlying structures will be self-limiting, providing a single layer of molecules once this step is completed.

After the self-limiting reaction has finished, the deposition chamber 733 may be purged off the first precursor material with a first purge process. For example, the control unit 715 may instruct the precursor gas controller 713 to disconnect the first precursor delivery system 702 (containing the first precursor material to be purged from the deposition chamber 733) and to connect a purge gas delivery system 707 to deliver a purge gas to the deposition chamber 733. In an embodiment the purge gas delivery system 707 may be a gaseous tank or other facility that provides a purge gas such as nitrogen, argon, xenon, or other gas to the deposition chamber 733, for a purge flow of between about 2 slm and about 20 slm, such as about 10 slm for a time period of between about 3 s and about 20 s. Additionally, the control unit 715 may also initiate the vacuum pump 729 in order to apply a pressure differential to the deposition chamber 733 to aid in the removal of the first precursor material. The purge gas, along with the vacuum pump 729, may purge the first precursor material from the deposition chamber 733.

After the purge of the first precursor material has been completed, the introduction of the second precursor material (e.g., propane) to the deposition chamber 733 may be initiated by the control unit 715 sending an instruction to the precursor gas controller 713 to disconnect the purge gas delivery system 707 and to connect the second precursor delivery system 703 (containing the second precursor material) to the deposition chamber 733. Once connected, the second precursor delivery system 703 can deliver the second precursor material to the injection unit 719. The injection unit 719 can then disperse the second precursor material into the deposition chamber 733.

In the embodiment discussed above to form a layer of silicon carbon nitride with dichlorosilane as the first precursor material and propane as the second precursor material, the second precursor material may be introduced into the deposition chamber 733 at any suitable flow rate, with a carrier gas at any suitable flow rate. However, as one of ordinary skill in the art will recognize, these flow rates are only intended to be illustrative, as any suitable process conditions may be utilized while remaining within the scope of the embodiments.

Additionally, in order to better control the composition of the individual elements within the blocking layer 701, the time which the second precursor material is pulsed into the deposition chamber 733 is controlled. For example, in one embodiment the second precursor material may be pulsed for a second time of between about 3 seconds and about 70 seconds, such as about 60 seconds. However, any suitable time may be utilized.

FIG. 7D illustrates a close-up view of the surface of the blocking layer 701 and illustrates that, in the embodiment in which a layer of silicon carbon nitride is desired to be formed using dichlorosilane as the first precursor material and propane as the second precursor material, under these process conditions the propane will react with the exposed surfaces (e.g., the product of the reaction of the first precursor material) in order to provide a surface wherein carbon is chemically bonded to the underlying surface (e.g., silicon) while the opposite surface is terminated with hydrogen atoms which are exposed to the ambient atmosphere within the deposition chamber 733.

After the reaction of the second precursor material has finished, the deposition chamber 733 may be purged off the second precursor material with a second purge process. For example, the control unit 715 may instruct the precursor gas controller 713 to disconnect the second precursor delivery system 703 (containing the second precursor material to be purged from the deposition chamber 733) and to connect the purge gas delivery system 707 to deliver the purge gas to the deposition chamber 733. In an embodiment the purge gas delivery system 707 may deliver the purge gas at a flow of between about 2 slm and about 20 slm, such as about 10 slm for a time period of between about 3 s and about 70 s. Additionally, the control unit 715 may also initiate the vacuum pump 729 in order to apply a pressure differential to the deposition chamber 733 to aid in the removal of the second precursor material. The purge gas, along with the vacuum pump 729, may purge the second precursor material from the deposition chamber 733.

After the purge of the second precursor material has been completed, the introduction of the third precursor material (e.g., ammonia) to the deposition chamber 733 may be initiated by the control unit 715 sending an instruction to the precursor gas controller 713 to disconnect the purge gas delivery system 707 and to connect the third precursor delivery system 705 (containing the third precursor material)

to the deposition chamber 733. Once connected, the third precursor delivery system 705 can deliver the third precursor material to the injection unit 719. The injection unit 719 can then disperse the third precursor material into the deposition chamber 733.

In the embodiment discussed above to form a layer of silicon carbon nitride with dichlorosilane as the first precursor material, propane as the second precursor material, and ammonia as the third precursor material, the third precursor material may be introduced into the deposition chamber 733 at any suitable flow rate with a carrier gas at any suitable flow rate. However, as one of ordinary skill in the art will recognize, these flow rates are only intended to be illustrative, as any suitable process conditions may be utilized while remaining within the scope of the embodiments.

Additionally, in order to better control the composition of the individual elements within the blocking layer 701, the time which the third precursor material is pulsed into the deposition chamber 733 is controlled. For example, in one embodiment the third precursor material may be pulsed for a third time of between about 3 seconds and about 20 seconds, such as about 16 seconds. However, any suitable time may be utilized.

FIG. 7E illustrates a close up view of the surface of the blocking layer 701 and illustrates that, in the embodiment in which a layer of silicon carbon nitride is desired to be formed using dichlorosilane as the first precursor material, propane as the second precursor material, and ammonia as the third precursor material, under these process conditions the ammonia will react with the exposed surfaces in order to provide a surface wherein nitrogen is chemically bonded to the underlying surfaces (e.g., silicon and carbon) while the opposite surface is terminated with hydrogen atoms which are exposed to the ambient atmosphere within the deposition chamber 733.

After the reaction of the third precursor material has finished, the deposition chamber 733 may be purged off the third precursor material with a third purge process. For example, the control unit 715 may instruct the precursor gas controller 713 to disconnect the third precursor delivery system 705 (containing the third precursor material to be purged from the deposition chamber 733) and to connect the purge gas delivery system 707 to deliver the purge gas to the deposition chamber 733. In an embodiment the purge gas delivery system 707 may deliver the purge gas at a flow of between about 2 slm and about 20 slm, such as about 10 slm for a time period of between about 3 s and about 20 s. Additionally, the control unit 715 may also initiate the vacuum pump 729 in order to apply a pressure differential to the deposition chamber 733 to aid in the removal of the third precursor material. The purge gas, along with the vacuum pump 729, may purge the third precursor material from the deposition chamber 733.

After the deposition chamber 733 has been purged using the third purge process, a first cycle for the formation of the blocking layer 701 has been completed, and a second cycle similar to the first cycle may be started. For example, the repeated cycle may introduce the first precursor material, purge with the purge gas, pulse with the second precursor material, purge with the purge gas, pulse with the third precursor material, and purge with the purge gas.

As can be seen, each cycle of the first precursor material, the second precursor material, and the third precursor material can deposit another layer of the desired material for the blocking layer 701 (e.g., SiCN). Additionally, each cycle also resets the exposed surface so that the exposed surface is prepared to receive the next cycle of the first precursor material, the second precursor material, and the third precursor material. These cycles may be repeated any suitable number of times to form the blocking layer 701 to any desired thickness.

Once the depositions cycles have been finished, a removal process may be performed to remove the substrates 50 from the deposition system 731. In one embodiment the removal process may include a gas line purge, a post purge (using, e.g., the third precursor material), a ramp down of the temperature from, e.g., 640° C. to about 300° C., and a back filling of the ambient within the deposition chamber to ambient atmosphere. Once this has been performed, the substrates 50 may be removed from the deposition systems 731.

By utilizing the process and the times as described above, the blocking layer 701 may be formed with a desired first composition. For example, using the times and temperatures as described above, the blocking layer may be formed with a silicon composition of between about 39.3%-atomic and about 42.13%-atomic, a carbon composition of between about 15.1%-atomic and 17.93%-atomic, and a nitrogen composition of between about 37.1%-atomic and about 39.93%-atomic. However, any suitable compositions may be utilized.

Figure 8A:
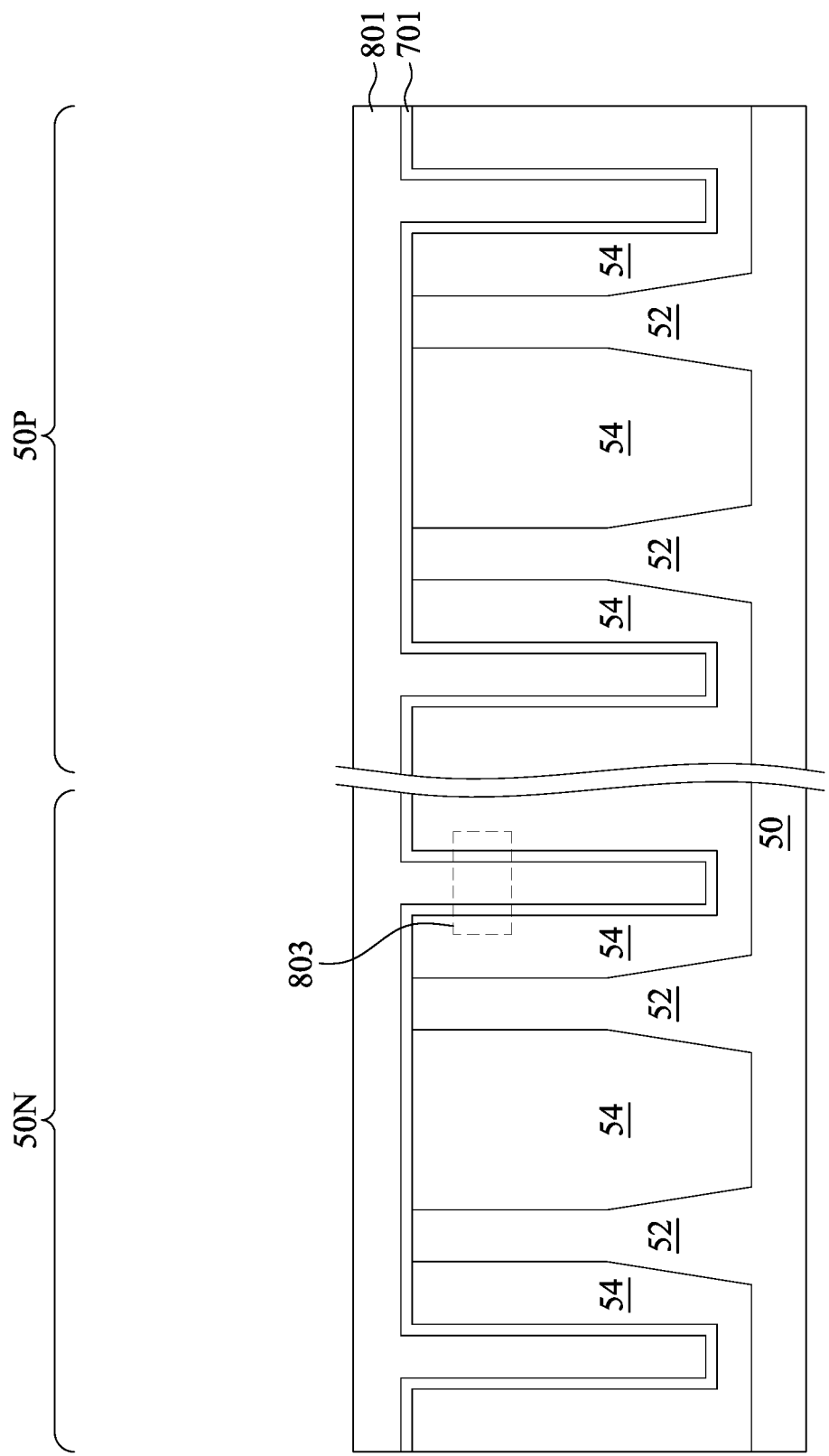

FIG. 8A illustrates formation of the bulk material 801 to fill and/or overfill the first openings 601 over the blocking layer 701. In an embodiment the bulk material 801 is a dielectric material which complements the blocking layer 701 in order to form a dielectric hybrid fin 901. In a particular embodiment the bulk material 801 is the same material as the blocking layer 701 (e.g., SiCN) although in other embodiments the material of the bulk material 801 may be different from the material of the blocking layer 701.

In embodiments in which the bulk material 801 is the same material as the material of the blocking layer 701, the bulk material 801 may be deposited in the same deposition chamber 733 as the blocking layer 701 by adjusting the deposition parameters but using the same precursors, such as the first precursor material (e.g., DCS), the second precursor material (e.g., propane), and the third precursor material (e.g., ammonia).

For example, once the blocking layer 701 has been formed with the first composition, the atomic layer deposition cycle for the formation of the bulk material 801 may be initiated by the control unit 715 ramping the temperature of the deposition chamber 733 to a second temperature higher than the deposition temperature of the blocking layer 701, such as about 640° C. However, any suitable temperature can be utilized.

Once the temperature has been stabilized, the control unit 715 can send an instruction to the precursor gas controller 713 to connect the first precursor delivery system 702 to the deposition chamber 733. Once connected, the first precursor delivery system 702 can deliver the first precursor material to the injection unit 719 through the precursor gas controller 713 and the manifold 717. The injection unit 719 can then disperse the first precursor material into the deposition chamber 733, wherein the first precursor material can be adsorbed and react with each of the exposed surfaces.

In the embodiment to form a layer of silicon carbon nitride as the bulk material 801, the first precursor material (e.g., DCS) may be flowed into the deposition chamber 733 at any suitable flow rate with a carrier gas at any suitable flow rate. However, any suitable flow rate may be utilized.

Additionally, in order to better control the composition of the individual elements within the bulk material 801, the time which the first precursor material is pulsed into the deposition chamber 733 is controlled. For example, in one embodiment the first precursor material may be pulsed for a fourth time which is larger than the first time (used to deposit the blocking layer 701) of between about 20 seconds and about 120 seconds, such as about 60 seconds. However, any suitable time may be utilized.

After the reaction of the first precursor material has finished, the deposition chamber 733 may be purged off the first precursor material with a fourth purge process. For example, the control unit 715 may instruct the precursor gas controller 713 to disconnect the first precursor delivery system 702 (containing the first precursor material to be purged from the deposition chamber 733) and to connect the purge gas delivery system 707 to deliver the purge gas to the deposition chamber 733. In an embodiment the purge gas may be introduced at a purge flow of between about 2 slm and about 20 slm, such as about 10 slm. Additionally, the control unit 715 may also initiate the vacuum pump 729 in order to apply a pressure differential to the deposition chamber 733 to aid in the removal of the first precursor material. The purge gas, along with the vacuum pump 729, may purge the first precursor material from the deposition chamber 733.

Additionally, because the deposition of the material for the bulk material 801 uses a longer pulse time for the flow of the first precursor material, the fourth purge process should also be extended. In an embodiment in which the first precursor material is pulsed for a time of between about 20 seconds to about 120 seconds, the fourth purge process can be performed for a time of between about 20 seconds and about 120 seconds. However, any suitable time may be utilized.

After the purge of the first precursor material has been completed, the introduction of the second precursor material (e.g., propane) to the deposition chamber 733 may be initiated by the control unit 715 sending an instruction to the precursor gas controller 713 to disconnect the purge gas delivery system 707 and to connect the second precursor delivery system 703 (containing the second precursor material) to the deposition chamber 733. Once connected, the second precursor delivery system 703 can deliver the second precursor material to the injection unit 719. The injection unit 719 can then disperse the second precursor material into the deposition chamber 733.

In the embodiment discussed above to form a layer of silicon carbon nitride with dichlorosilane as the first precursor material and propane as the second precursor material, the second precursor material may be introduced into the deposition chamber 733 at any suitable flow rate with a carrier gas at any suitable flow rate. However, as one of ordinary skill in the art will recognize, these flow rates are only intended to be illustrative, as any suitable process conditions may be utilized while remaining within the scope of the embodiments.

Additionally, in order to better control the composition of the individual elements within the bulk material 801, the time which the second precursor material is pulsed into the deposition chamber 733 is controlled. For example, in one embodiment the second precursor material may be pulsed for a fifth time that is longer than the second time (e.g., the pulse of the second precursor material during deposition of the blocking layer 701) of between about 70 seconds and about 200 seconds, such as about 120 seconds. However, any suitable time may be utilized.

After the reaction of the second precursor material has finished, the deposition chamber 733 may be purged off the second precursor material with a fifth purge process. For example, the control unit 715 may instruct the precursor gas controller 713 to disconnect the second precursor delivery system 703 (containing the second precursor material to be purged from the deposition chamber 733) and to connect the purge gas delivery system 707 to deliver the purge gas to the deposition chamber 733. In an embodiment the purge gas delivery system 707 may deliver the purge gas at a flow of between about 2 slm and about 20 slm, such as about 10 slm. Additionally, the control unit 715 may also initiate the vacuum pump 729 in order to apply a pressure differential to the deposition chamber 733 to aid in the removal of the second precursor material. The purge gas, along with the vacuum pump 729, may purge the second precursor material from the deposition chamber 733.

Additionally, because the deposition of the material for the bulk material 801 uses a longer pulse time for the flow of the second precursor material, the fifth purge process should also be extended. In an embodiment in which the second precursor material is pulsed for a time of between about 70 seconds to about 200 seconds, the fifth purge process can be performed for a time of between about 70 seconds and about 200 seconds. However, any suitable time may be utilized.

After the purge of the second precursor material has been completed, the introduction of the third precursor material (e.g., ammonia) to the deposition chamber 733 may be initiated by the control unit 715 sending an instruction to the precursor gas controller 713 to disconnect the purge gas delivery system 707 and to connect the third precursor delivery system 705 (containing the third precursor material) to the deposition chamber 733. Once connected, the third precursor delivery system 705 can deliver the third precursor material to the injection unit 719. The injection unit 719 can then disperse the third precursor material into the deposition chamber 733.

In the embodiment discussed above to form a layer of silicon carbon nitride with dichlorosilane as the first precursor material, propane as the second precursor material, and ammonia as the third precursor material, the third precursor material may be introduced into the deposition chamber 733 at any suitable flow rate with a carrier gas at any suitable flow rate. However, as one of ordinary skill in the art will recognize, these flow rates are only intended to be illustrative, as any suitable process conditions may be utilized while remaining within the scope of the embodiments.

Additionally, in order to better control the composition of the individual elements within the bulk material 801, the time which the third precursor material is pulsed into the deposition chamber 733 is controlled. For example, in one embodiment the third precursor material may be pulsed for a sixth time of between about 20 seconds and about 120 seconds, such as about 60 seconds. However, any suitable time may be utilized.

After the reaction of the third precursor material has finished, the deposition chamber 733 may be purged off the third precursor material with a sixth purge process. For example, the control unit 715 may instruct the precursor gas controller 713 to disconnect the third precursor delivery system 705 (containing the third precursor material to be purged from the deposition chamber 733) and to connect the purge gas delivery system 707 to deliver the purge gas to the deposition chamber 733. In an embodiment the purge gas delivery system 707 may deliver the purge gas at a flow of between about 2 slm and about 20 slm, such as about 10 slm. Additionally, the control unit 715 may also initiate the vacuum pump 729 in order to apply a pressure differential to the deposition chamber 733 to aid in the removal of the third precursor material. The purge gas, along with the vacuum pump 729, may purge the third precursor material from the deposition chamber 733.

Additionally, because the deposition of the material for the bulk material 801 uses a longer pulse time for the flow of the third precursor material, the sixth purge process should also be extended. In an embodiment in which the third precursor material is pulsed for a time of between about 20 seconds to about 120 seconds, the sixth purge process can be performed for a time of between about 20 seconds and about 120 seconds. However, any suitable time may be utilized.

After the deposition chamber 733 has been purged using the sixth purge process, a first cycle for the formation of the bulk material 801 has been completed, and a second cycle similar to the first cycle may be started. For example, the repeated cycle may introduce the first precursor material, purge with the purge gas, pulse with the second precursor material, purge with the purge gas, pulse with the third precursor material, and purge with the purge gas.

As can be seen, each cycle of the first precursor material, the second precursor material, and the third precursor material can deposit another layer of the desired material for the bulk material 801 (e.g., SiCN). Additionally, each cycle additionally resets the exposed surface so that the exposed surface is prepared to receive the next cycle of the first precursor material, the second precursor material, and the third precursor material. These cycles may be repeated any suitable number of times form the bulk material 801 to any suitable thickness.

Figure 8B:
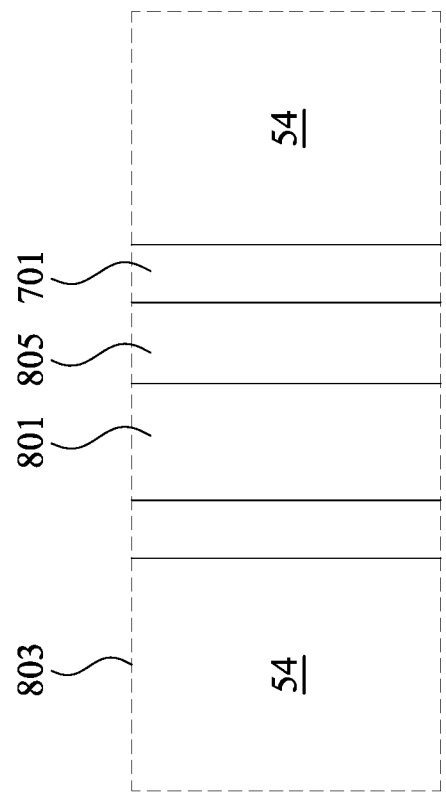

FIG. 8B illustrates a close up view of the dashed box labeled 803 in FIG. 8A. As can be seen, during the deposition process of the bulk material 801 within the first openings 601, the material of the bulk material 801 will grow from each of the surfaces and will, eventually, merge together as the two surfaces come into contact with each other. As such, in some embodiments, the bulk material 801 may have a seam 805 located within the bulk material 801. In other embodiments, subsequent annealing processes or increased temperatures may expand the material of the bulk material 801 in order to help close any voids.

By utilizing the times and temperatures as described above, the bulk material 801 may be formed with a desired second composition that is different from the first composition of the blocking layer 701. For example, using the times as described above, the bulk material 801 may be formed with a silicon composition greater than the blocking layer 701 of between about 45.7%-atomic and about 48.73%-atomic, a carbon composition greater than the blocking layer 701 of between about 19.1% and about 22.13%-atomic, and a nitrogen composition less than the blocking layer 701 of between about 26.1%-atomic and about 29.13%-atomic. However, any suitable compositions may be utilized.

Figure 9:
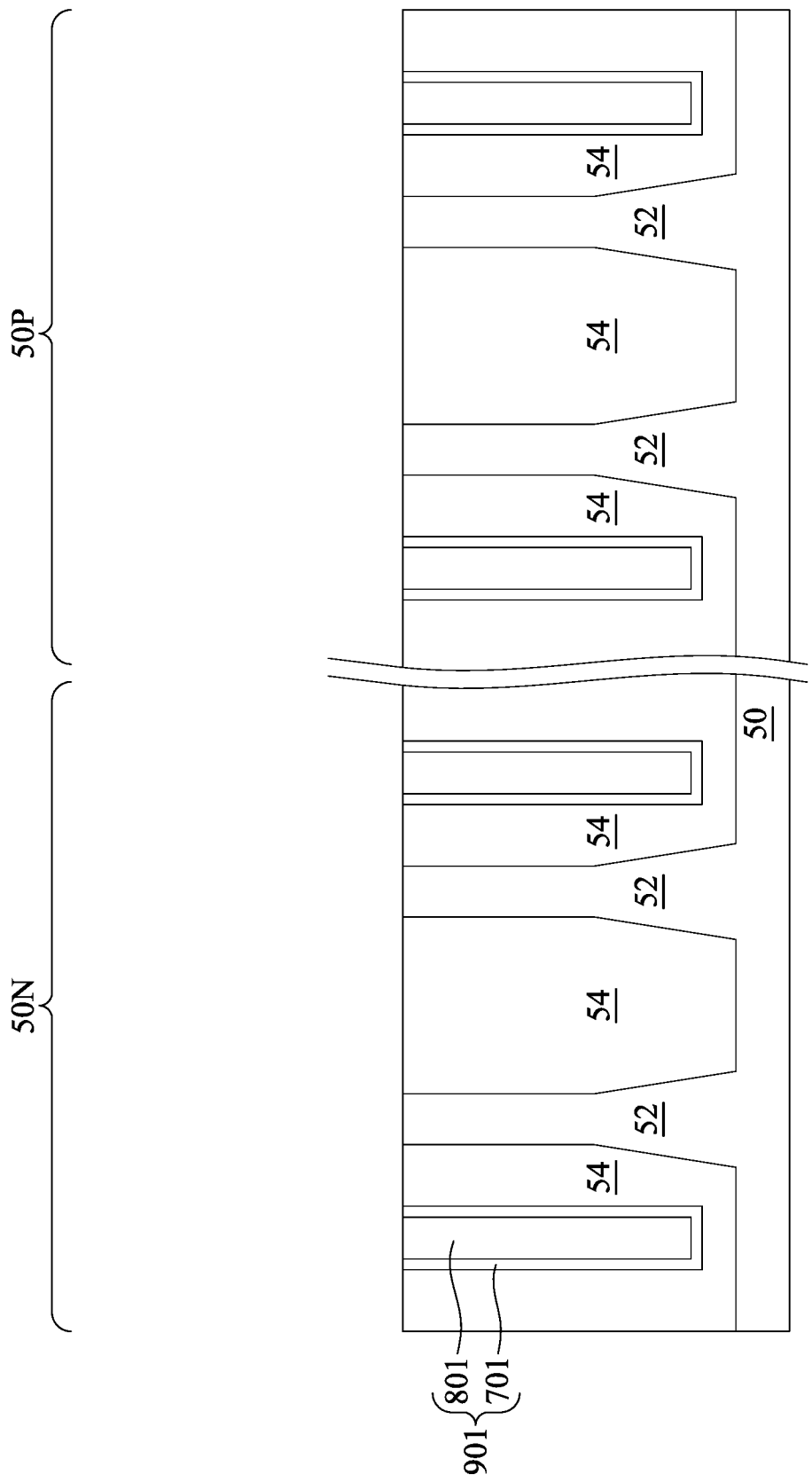

FIG. 9 illustrates that, once the bulk material 801 has been deposited, the bulk material 801 and the blocking layer 701 may be planarized with the insulation material 54 and the fins 52 in order to remove excess material of the blocking layer 701 and the bulk material 801 from outside of the first openings 601 and to form the dielectric hybrid fin 901. In an embodiment the planarization may be performed using a chemical mechanical polishing process. However, any suitable planarization process (e.g., a grinding process or an etch back process) may be utilized.

By utilizing the combination of the blocking layer 701 and the bulk material 801, the overall etch rate of the hybrid fin 901 during subsequent etching process (such as the recessing of the insulation material 54 described below with respect to FIG. 10), may be reduced. For example, while the blocking layer 701 may see a removal of about 10.9 Å during the subsequent etching, the bulk material 801 may see a smaller reduction, such as about 6.3 Å. Such a reduction allows the overall hybrid fin 901 to better withstand the etching process and prevent subsequent penetration of adverse chemicals, leading to either a smaller device or a larger yield.

Figure 10:
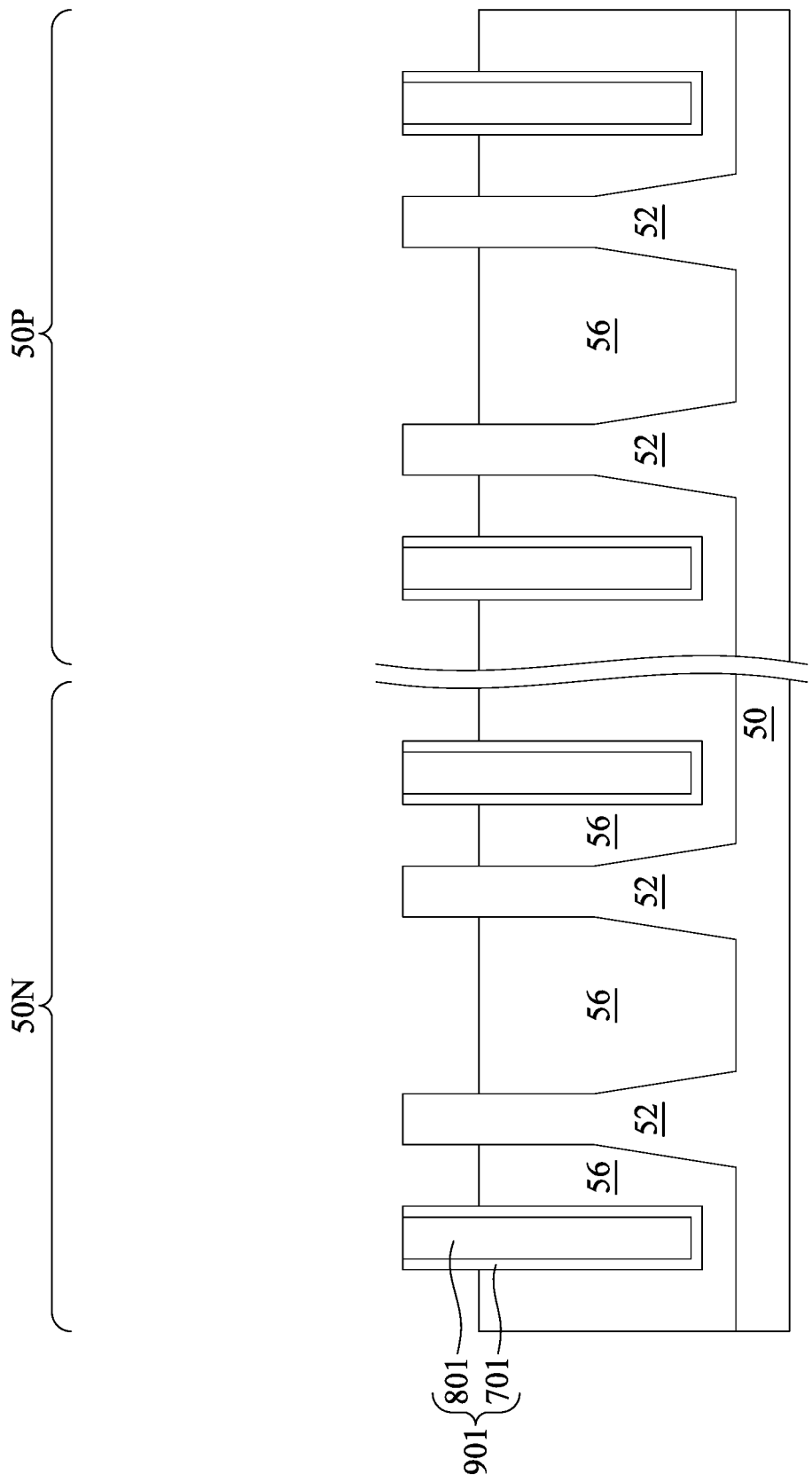

In FIG. 10, the insulation material 54 is recessed to form Shallow Trench Isolation (STI) regions 56. The insulation material 54 is recessed such that upper portions of fins 52 and the hybrid fin 901 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52 and the hybrid fin 901). For example, an oxide removal using, for example, dilute hydrofluoric (dHF) acid may be used.

The process described with respect to FIGS. 2 through 11 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, or the like.

Further in FIG. 10, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 11:
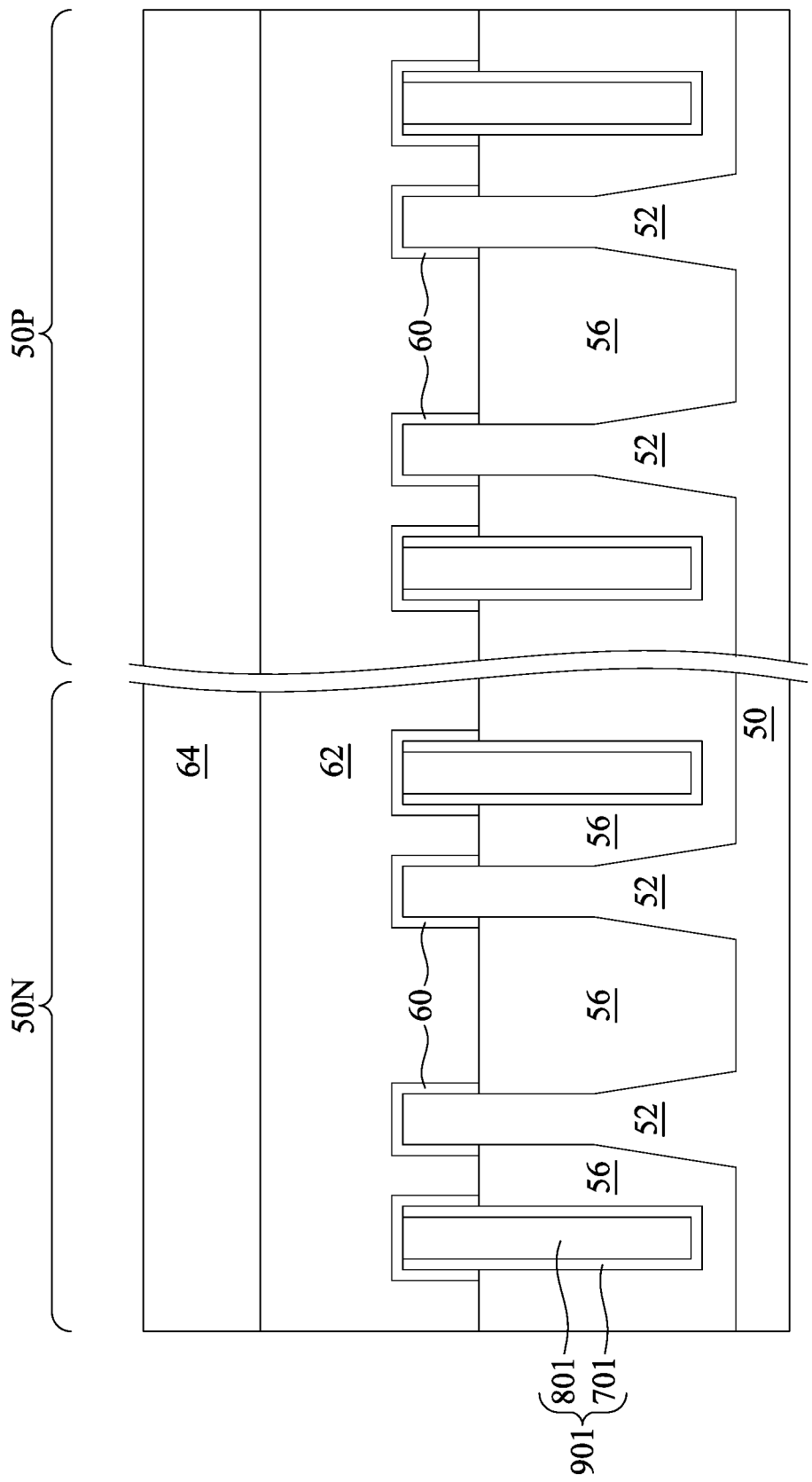

In FIG. 11, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 12A through 20B illustrate various additional steps in the manufacturing of embodiment devices. FIGS. 12A through 20B illustrate features in either of the n-type region 50N and the p-type region 50P. For example, the structures illustrated in FIGS. 12A through 20B may be applicable to both the n-type region 50N and the p-type region 50P. Differences (if any) in the structures of the n-type region 50N and the p-type region 50P are described in the text accompanying each figure.

Figure 12B:
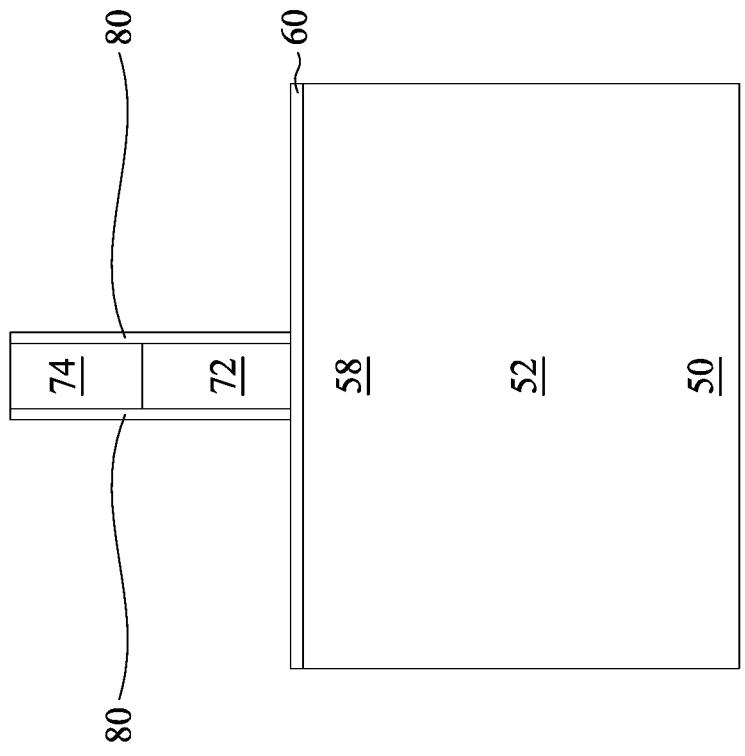
Figure 12A:
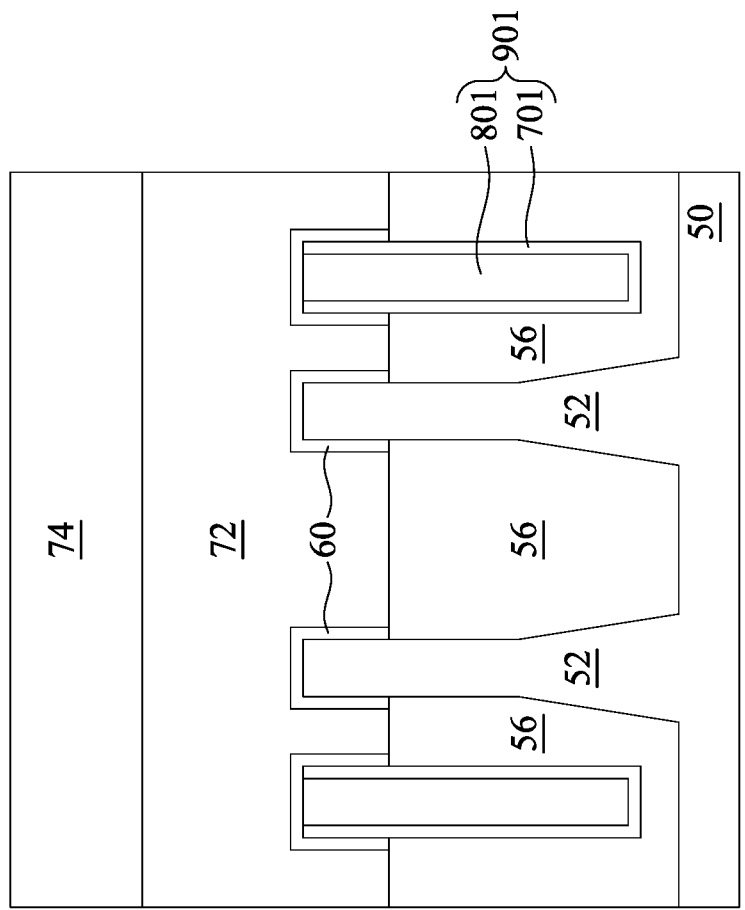

In FIGS. 12A and 12B, the mask layer 64 (see FIG. 11) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 12A and 12B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 10, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figures 13A, 13B:
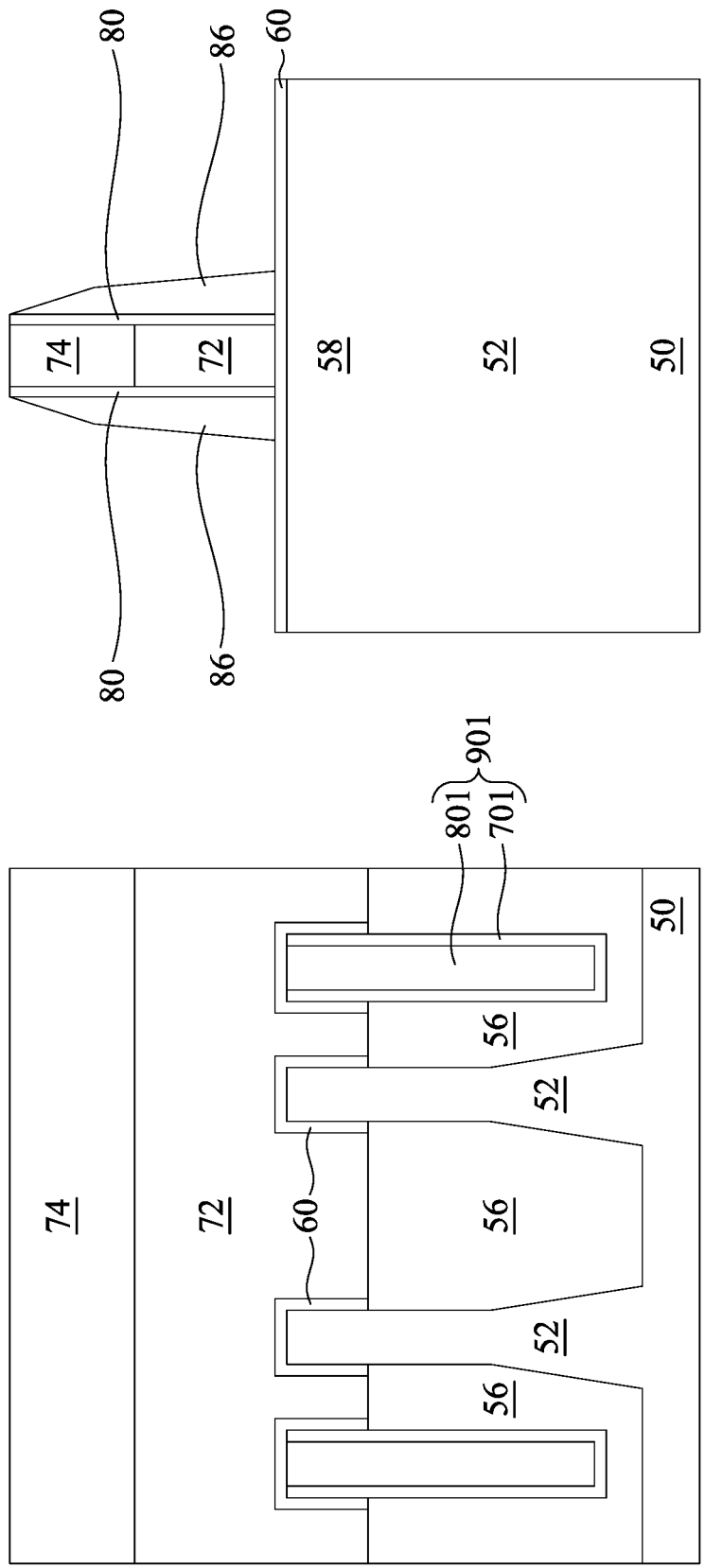

In FIGS. 13A and 13B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using different structures and steps. For example, LDD regions for n-type devices may be formed prior to forming the gate seal spacers 80 while the LDD regions for p-type devices may be formed after forming the gate seal spacers 80.

Figure 14B:
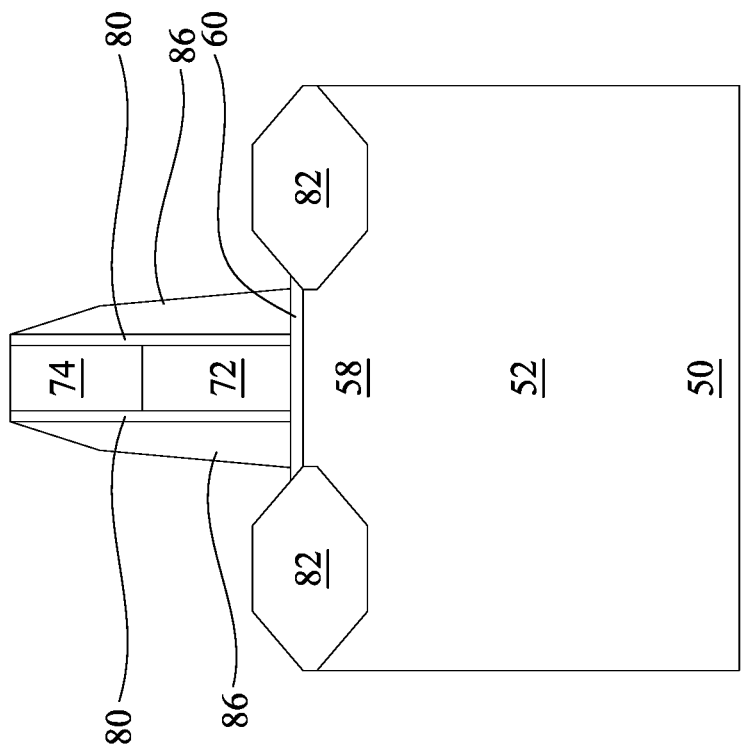
Figure 14A:
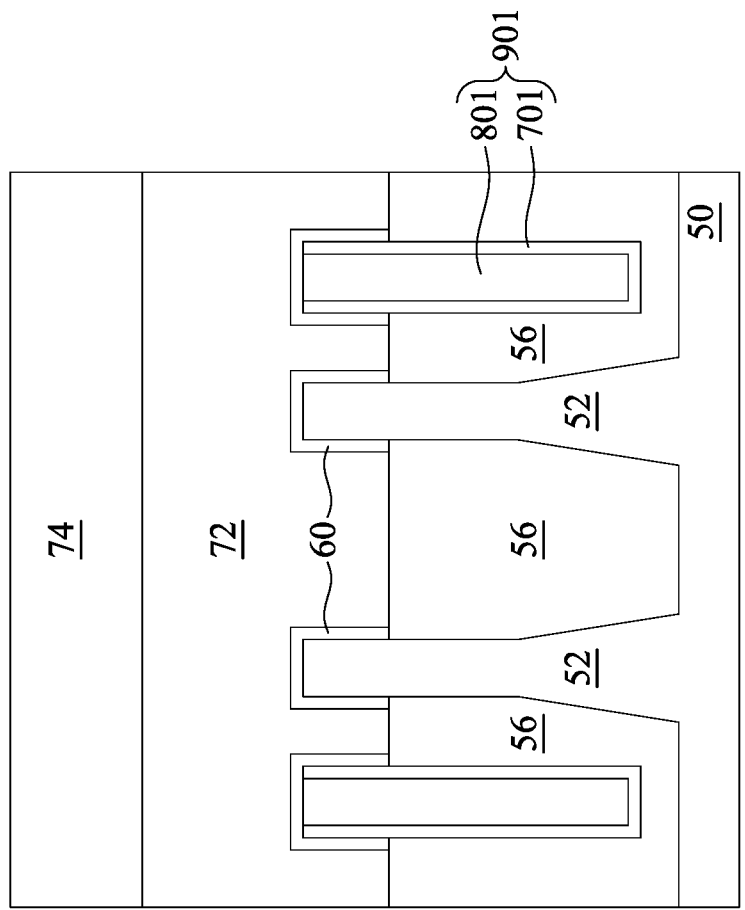
Figure 14D:
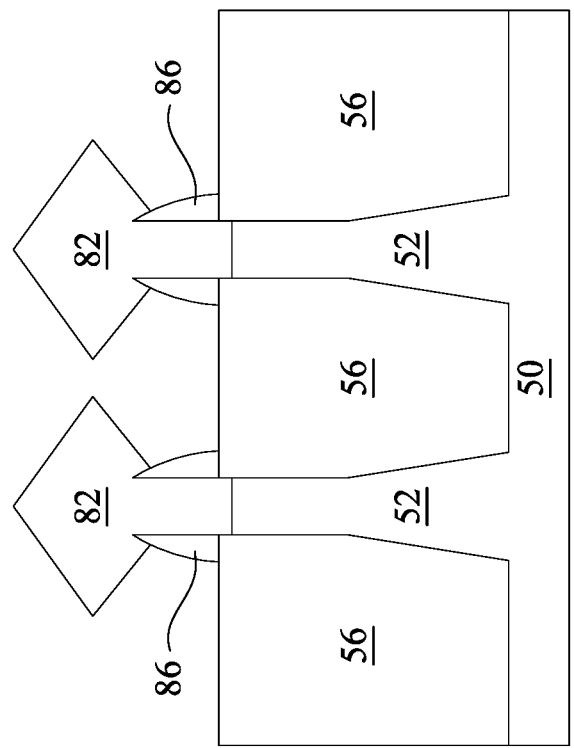
Figure 14C:
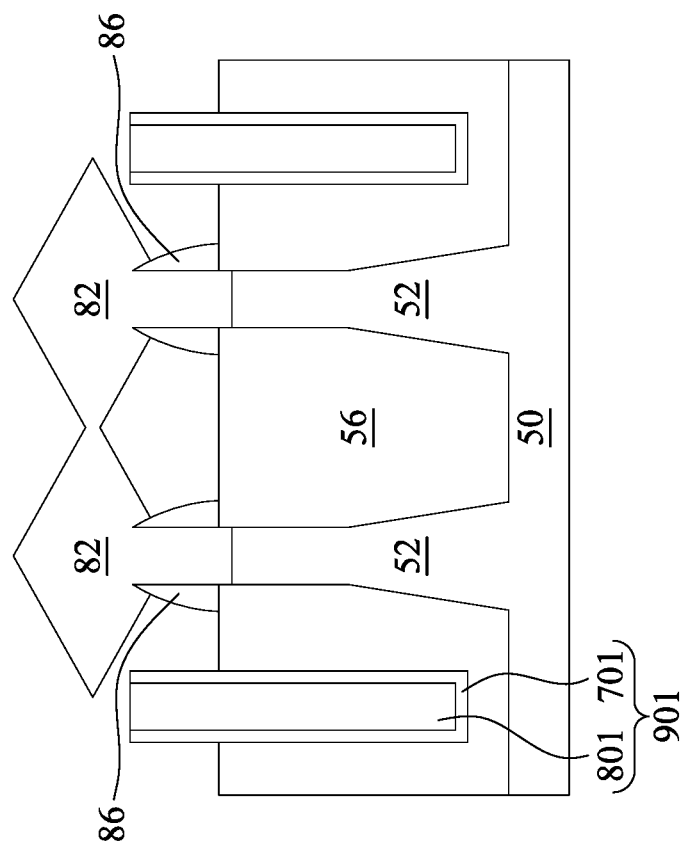

In FIGS. 14A and 14B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 14C. In other embodiments, adjacent source/drain regions 82 remain separated after the epitaxy process is completed as illustrated by FIG. 14D. In the embodiments illustrated in FIGS. 14C and 14D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

In FIGS. 15A and 15B, a first interlayer dielectric (ILD) 88 is deposited over the structure illustrated in FIGS. 14A and 14B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 16B:
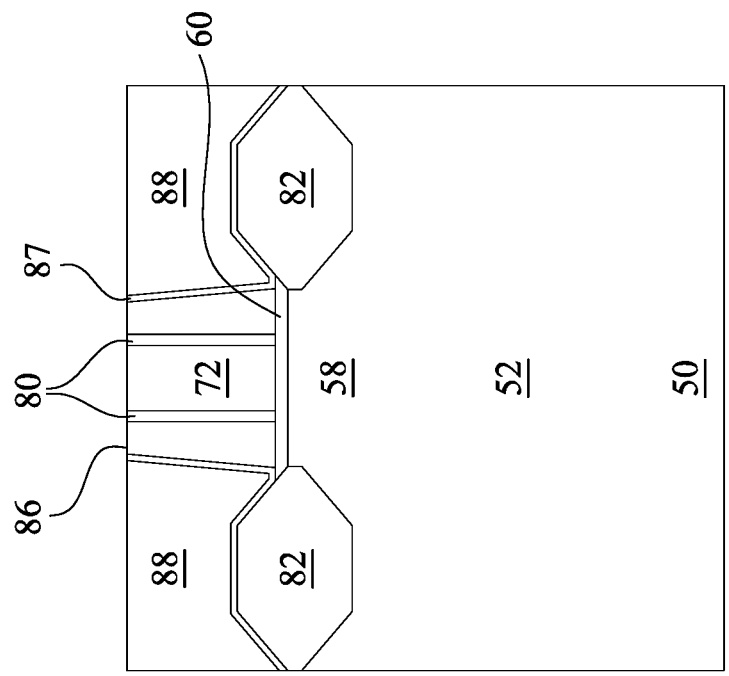
Figure 16A:
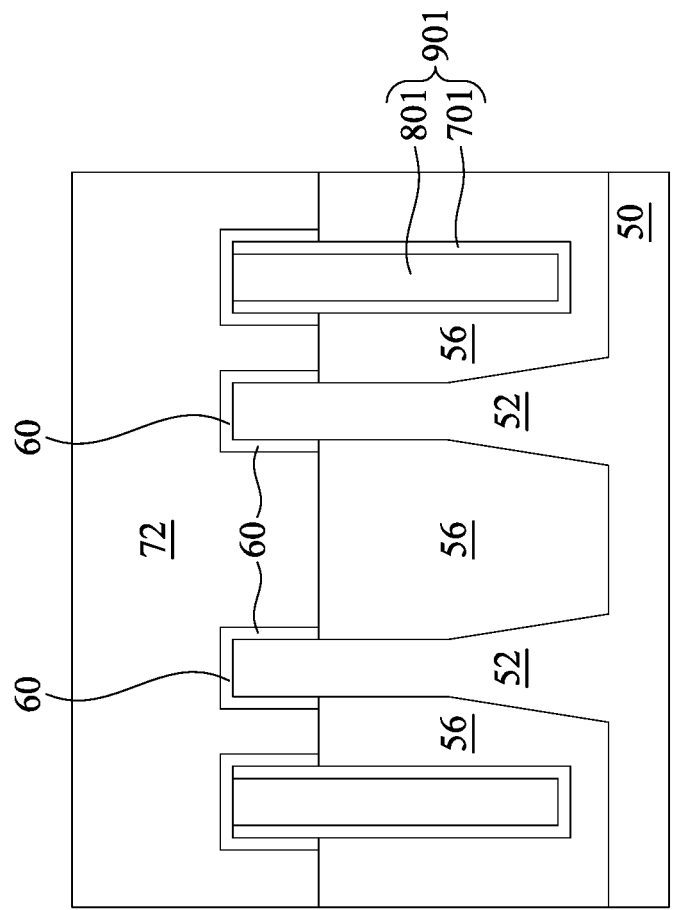

In FIGS. 16A and 16B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 17B:
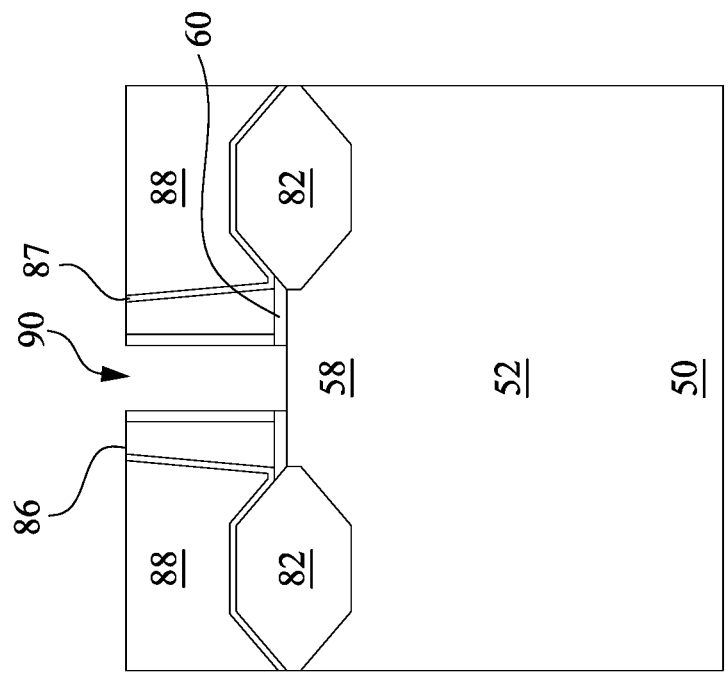
Figure 17A:
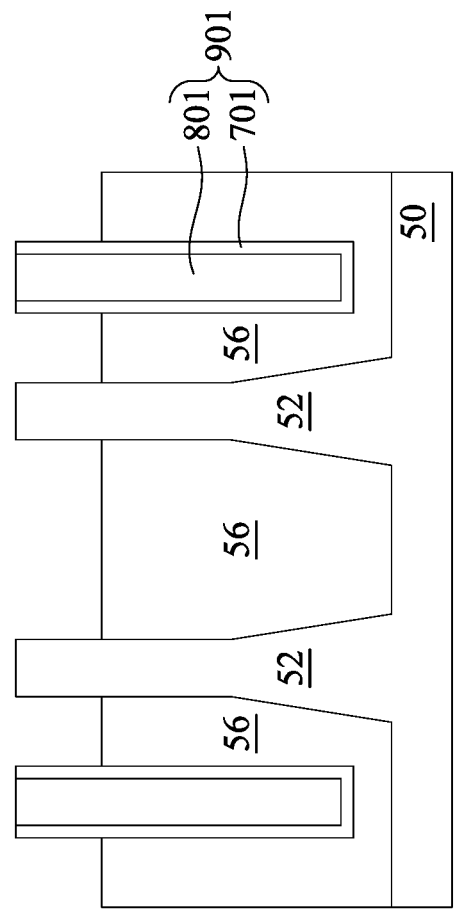

In FIGS. 17A and 17B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 18B:
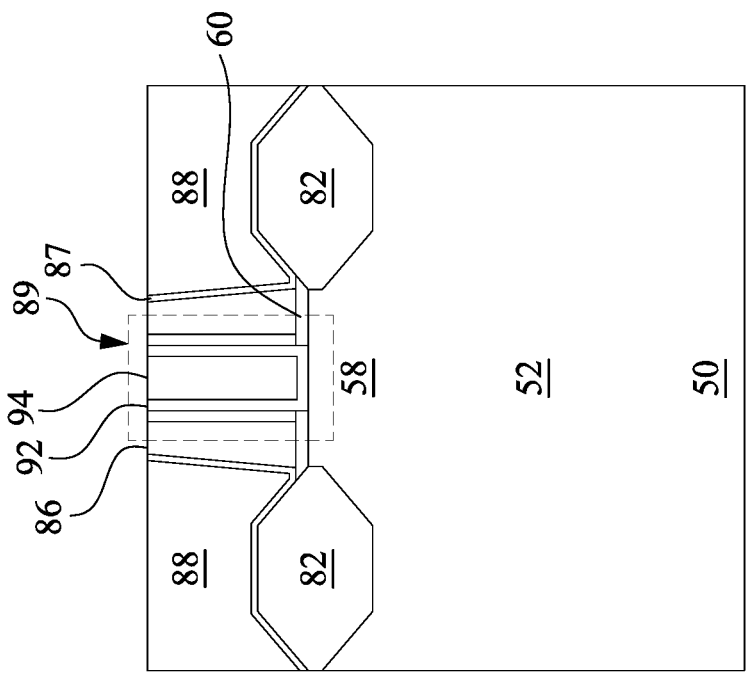
Figure 18A:
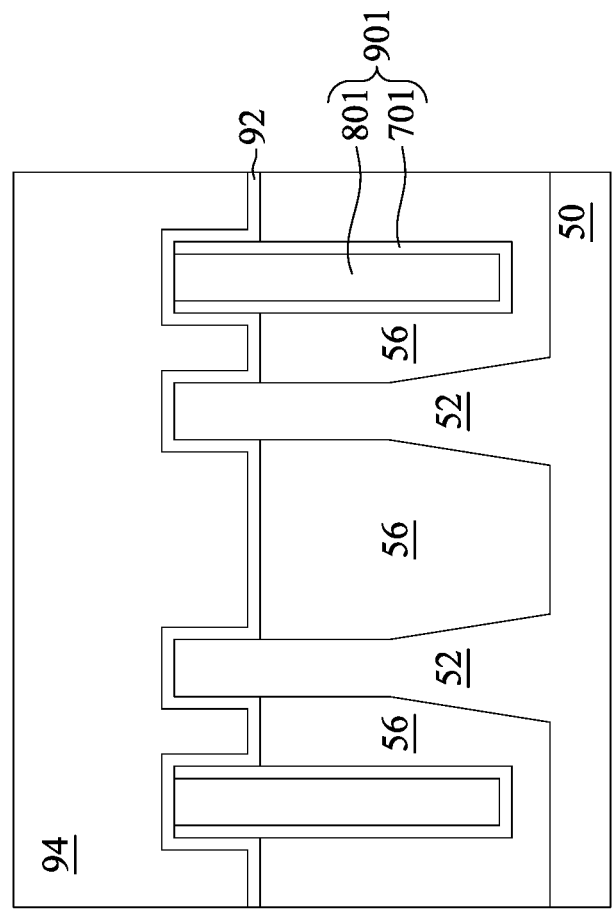
Figure 18C:
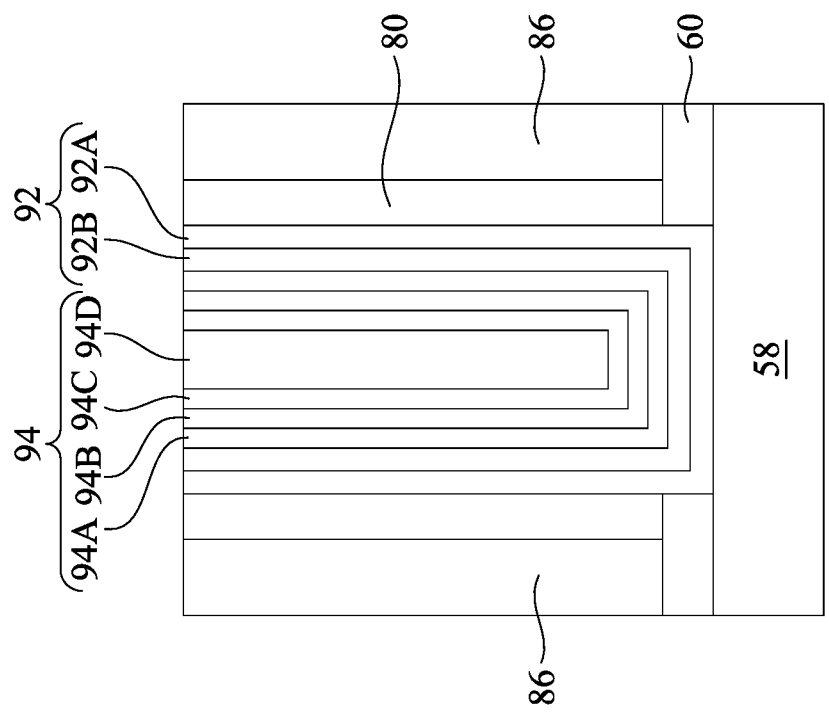

In FIGS. 18A and 18B, gate dielectric layers 92 and gate electrodes 94 are formed for replacement gates. FIG. 18C illustrates a detailed view of region 89 of FIG. 18B. Gate dielectric layers 92 may include one or more layers (e.g. gate dielectric layers 92A and 92B) deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, or combinations thereof. The gate dielectric layers 92 may include a dielectric layer having a k value greater than about 7.0. The formation methods of the gate dielectric layers 92 may include Molecular-Beam Deposition (MBD), ALD, PECVD, or the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 18B, the gate electrode 94 may comprise any number of liner layers 94A, any number of work function tuning layers 94B, a fill material 94C, and another fill material 94D as illustrated by FIG. 18C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 19B:
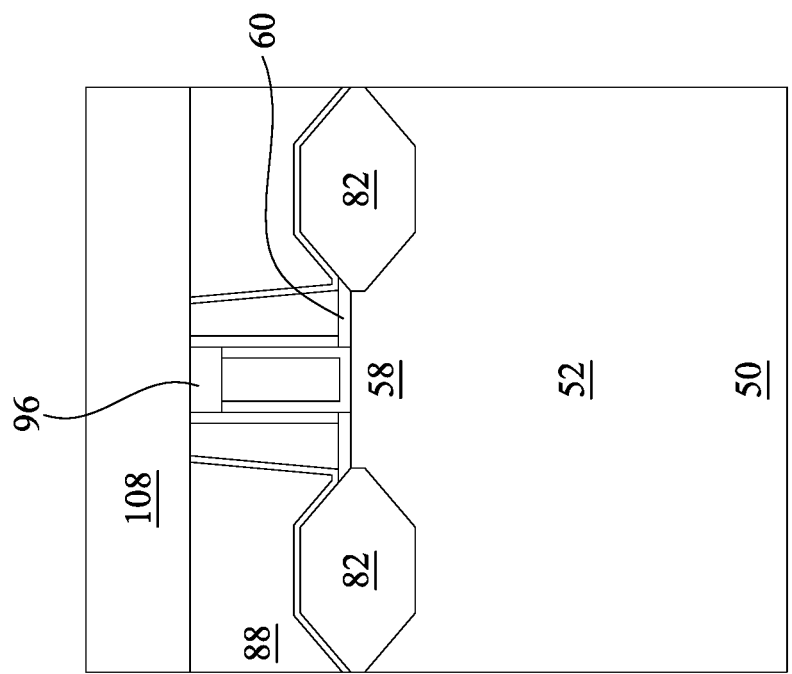
Figure 19A:
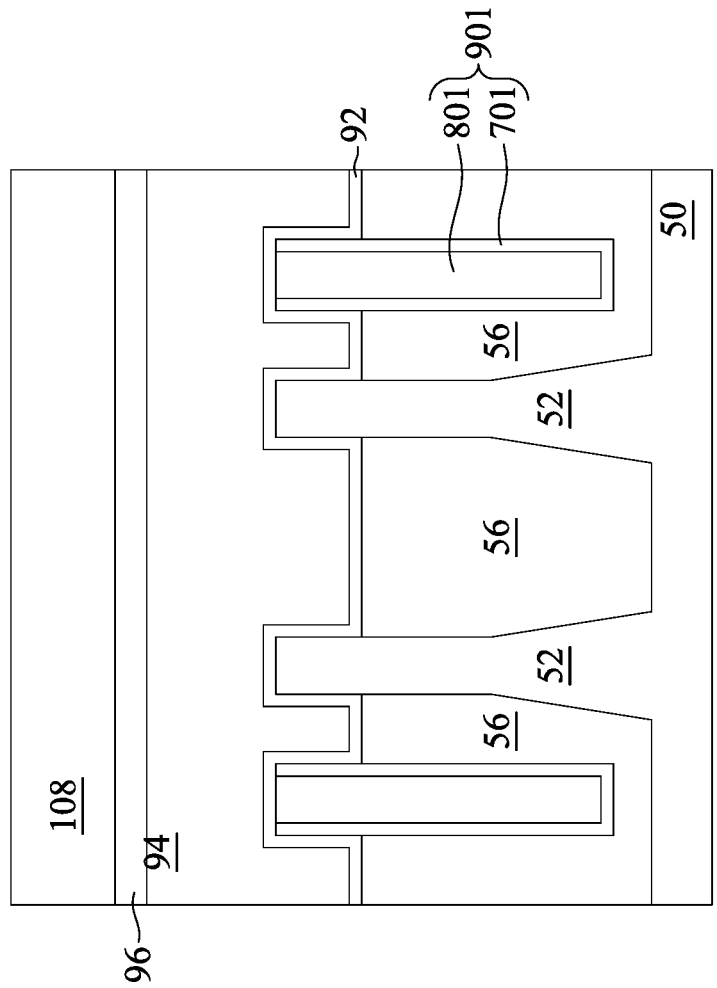

In FIGS. 19A and 19B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 19A and 19B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 20A and 20B) penetrate through the second ILD 108 and the gate mask 96 to contact the top surface of the recessed gate electrode 94.

Figure 20B:
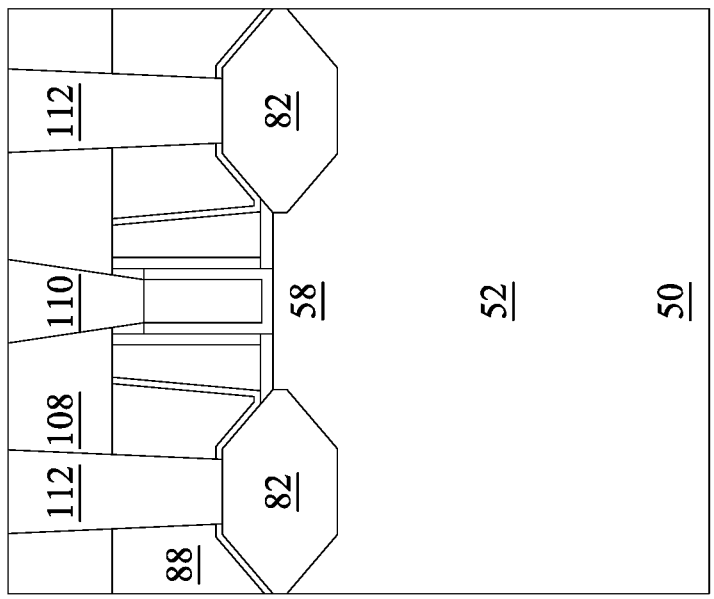
Figure 20A:
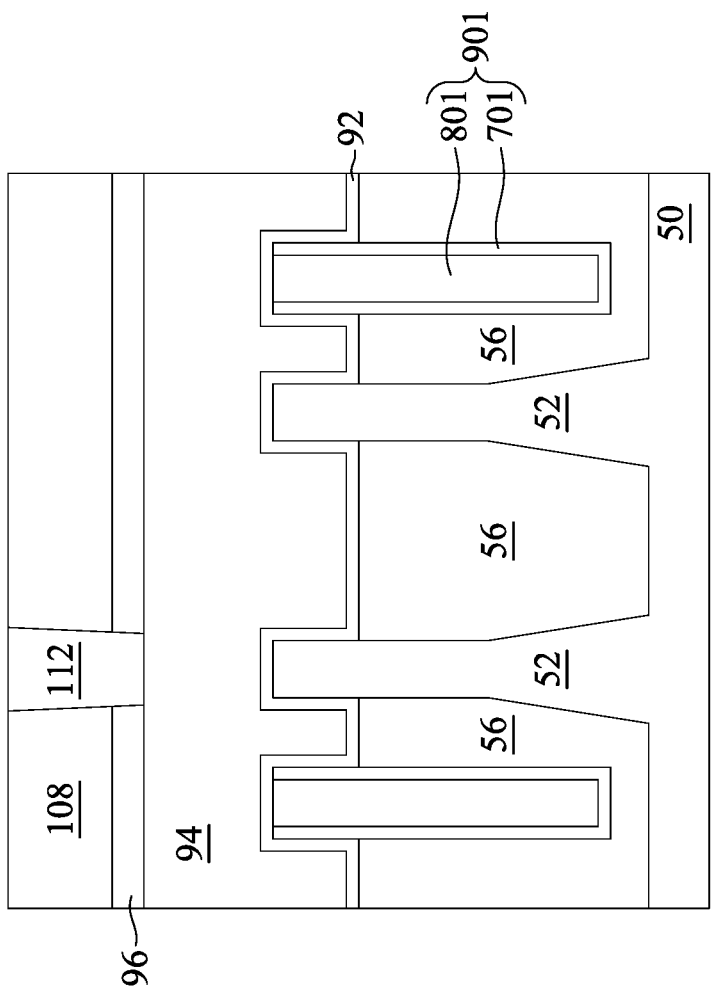

In FIGS. 20A and 20B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Figure 21A:
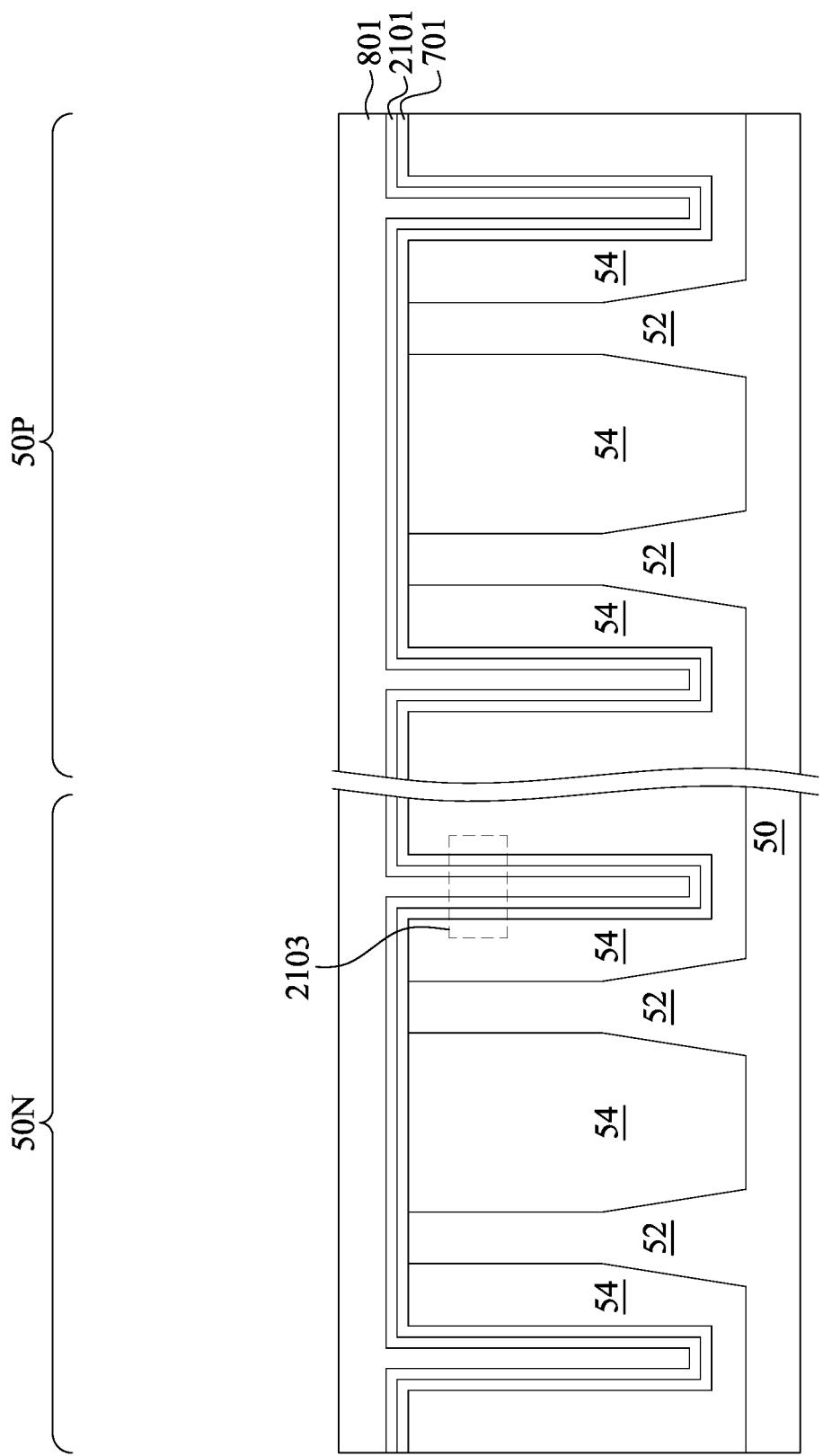
Figure 21B:
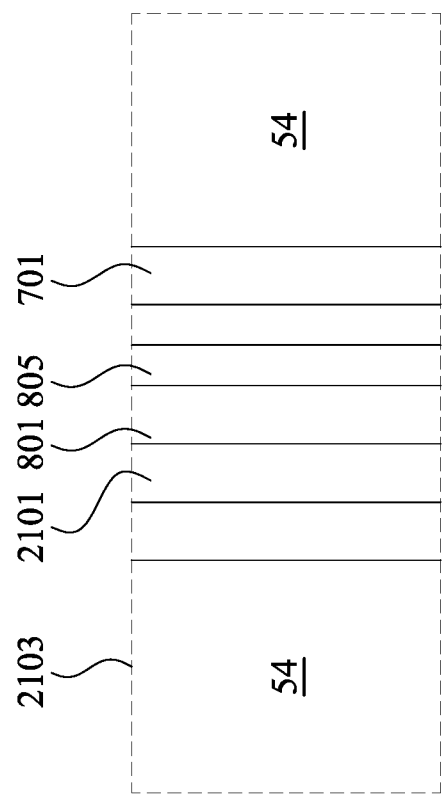

FIGS. 21A-21B illustrate yet another embodiment in which the blocking layer 701 and the bulk material 801 are joined within the first opening 601 by an intermediate material 2101, with FIG. 21B illustrating a close up view of the dashed line 2103 in FIG. 21A. In this embodiment, after the blocking layer 701 has been deposited, the intermediate material 2101 is deposited prior to the deposition of the bulk material 801. In an embodiment the intermediate material 2101 may be deposited using the same precursors and same processes as described above with respect to the bulk material 801. In this embodiment, however, the temperature of the deposition process is modified to be different than the deposition process for the bulk material 801. For example, in an embodiment in which the bulk material 801 is deposited at a temperature of 640° C., the deposition process of the intermediate material 2101 may be performed at a lower temperature, such as the temperature used for the deposition of the blocking layer 701, such as about 620° C., although any suitable temperature may be utilized. In some embodiments the intermediate material 2101 may be deposited to any suitable thickness.

By utilizing the processes and temperatures as described above, the intermediate material 2101 may be formed to have different compositions from either the blocking layer 701 or the bulk material 801. For example, when the intermediate material 2101 is formed at a temperature of about 620° C., the intermediate material 2101 may be formed to have a silicon composition of between about 42.9%-atomic and about 46.23%-atomic, a carbon composition of between about 16.6%-atomic and about 19.93%-atomic, and a nitrogen composition of between about 30.5%-atomic and about 33.83%-atomic. However, any suitable composition may be utilized.

Once the intermediate material 2101 has been deposited, the bulk material 801 may be deposited to fill and/or overfill a remainder of the first opening 601. In some embodiments the bulk material 801 may be deposited as described above with respect to FIG. 8A using a temperature such as 640° C. However, any suitable process may be utilized.

Additionally, once the bulk material 801 has been deposited, a remainder of the process may be performed as described above. For example, the bulk material 801, the intermediate material 2101, and the blocking layer 701 may be planarized, the isolation regions 56 may be recessed to expose the fins 52, and a gate is formed. However, any suitable processes may be utilized.

By utilizing the hybrid fin 901 as described herein with the intermediate material 2101, the overall etch rate of the hybrid fin 901 during subsequent etching process (such as the recessing of the insulation material 54 described above with respect to FIG. 10), may be reduced. For example, while the blocking layer 701 may see a removal of about 10.9 Å during the subsequent etching, the intermediate material 2101 may see a smaller reduction, such as 7.9 Å, while the bulk material 801 may see an even smaller reduction, such as about 6.3 Å. Such a reduction allows the overall hybrid fin 901 to better withstand the etching process and prevent subsequent penetration of adverse chemicals, leading to either a smaller device or a larger yield.

In accordance with an embodiment, a method of manufacturing a semiconductor device, the method includes: forming an opening within a dielectric material, the dielectric material being located between semiconductor fins; and depositing a first dielectric material within the opening, the depositing the first dielectric material including: pulsing a first precursor material for a first time of between about 20 seconds and about 120 seconds; pulsing a second precursor material for a second time of between about 70 seconds and about 200 seconds, the second precursor material being different from the first precursor material; and pulsing a third precursor material for a third time of between about 20 seconds and about 120 seconds, the third precursor material being different from both the first precursor material and the second precursor material. In an embodiment the method further includes, prior to the depositing the first dielectric material, depositing a blocking layer within the opening, the depositing the blocking layer including: pulsing the first precursor material for a fourth time less than the first time; pulsing the second precursor material for a fifth time less than the second time; and pulsing the third precursor material for a sixth time less than the third time. In an embodiment the fourth time is between about 3 seconds and about 20 seconds, wherein the fifth time is between about 3 seconds and about 70 seconds, and wherein the sixth time is between about 3 seconds and about 20 seconds. In an embodiment the first precursor material comprises dichlorosilane, wherein the second precursor material comprises propane, and wherein the third precursor material comprises ammonia. In an embodiment the first dielectric material comprises silicon carbon nitride. In an embodiment the silicon carbon nitride has a silicon concentration of between about 45.7% and 48.73%, a carbon concentration of between about 19.1% and about 22.13%, and a nitrogen concentration of between about 26.1% and about 29.13%. In an embodiment the blocking layer has a silicon concentration between about 39.3% and about 42.13%, a carbon concentration of between about 15.1% and 17.93%, and a nitrogen concentration of between about 37.1% and 39.93%.

In accordance with another embodiment, a method of manufacturing a semiconductor device includes: depositing a blocking layer to line an opening in a dielectric material between semiconductor fins, the depositing the blocking layer including: introducing a first precursor material for a first time; after the introducing the first precursor material, introducing a second precursor material for a second time, the second precursor material being different from the first precursor material; and after the introducing the second precursor material, introducing a third precursor material for a third time, the third precursor material being different from both the first precursor material and the second precursor material; filling a remainder of the opening by depositing a bulk material, the depositing the bulk material including: introducing the first precursor material for a fourth time larger than the first time; after the introducing the first precursor material to deposit the bulk material, introducing the second precursor material for a fifth time larger than the second time; and after the introducing the second precursor material to deposit the bulk material, introducing the third precursor material for a sixth time larger than the third time. In an embodiment the method further includes: planarizing the blocking layer with the dielectric material and the semiconductor fins; and recessing the dielectric material to expose sidewalls of the semiconductor fins and sidewalls of the blocking layer. In an embodiment the fourth time is between about 20 seconds and about 120 seconds, wherein the fifth time is between about 70 seconds and about 200 seconds, and wherein the sixth time is between about 20 seconds and about 120 seconds. In an embodiment the first time is between about 3 seconds and about 20 seconds, wherein the second time is between about 3 seconds and about 70 seconds, and wherein the third time is between about 3 seconds and about 20 seconds. In an embodiment the method further includes, prior to the filling the remainder of the opening, depositing an intermediate material, wherein the depositing the intermediate material includes: introducing the first precursor material for the fourth time; after the introducing the first precursor material to deposit the intermediate material, introducing the second precursor material for the fifth time; and after the introducing the second precursor material to deposit the intermediate material, introducing the third precursor material for the sixth time, wherein the depositing the intermediate material is performed at a same temperature as the depositing the blocking layer. In an embodiment the bulk material has a silicon concentration of between about 45.7% and 48.73%, a carbon concentration of between about 19.1% and about 22.13%, and a nitrogen concentration of between about 26.1% and about 29.13%. In an embodiment the blocking layer has a silicon concentration between about 39.3% and about 42.13%, a carbon concentration of between about 15.1% and 17.93%, and a nitrogen concentration of between about 37.1% and 39.93%.

In accordance with yet another embodiment, a semiconductor device includes: a semiconductor fin extending through a dielectric material; and a hybrid dielectric fin extending from within the dielectric material, the hybrid dielectric fin including: a blocking layer, the blocking layer comprising a first material with a first composition; and a bulk material, the bulk material comprising the first material with a second composition different from the first composition, the second composition having a larger carbon concentration than the first composition. In an embodiment the first material is silicon carbon nitride. In an embodiment the second composition has a carbon concentration of about 19.1%. In an embodiment the second composition has a silicon concentration that is greater than a silicon concentration of the first composition. In an embodiment the second composition has a nitrogen concentration that is less than a nitrogen concentration of the first composition. In an embodiment the second composition comprises has a silicon concentration of between about 45.7% and 48.73%, a carbon concentration of between about 19.1% and about 22.13%, and a nitrogen concentration of between about 26.1% and about 29.13%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a hybrid dielectric fin, the hybrid dielectric fin comprising:
      a bulk material with a first carbon concentration; and
      a blocking layer lining the bulk material, the blocking layer having a second carbon concentration less than the first carbon concentration;
   a semiconductor fin adjacent to the hybrid dielectric fin, wherein the hybrid dielectric fin has a top surface that is planar with the semiconductor fin;
   a gate dielectric layer adjacent to the semiconductor fin; and
   a shallow trench isolation extending from the semiconductor fin to the blocking layer.

2. The semiconductor device of claim 1, wherein the blocking layer has a carbon composition of between about 15.1%-atomic and 17.93%-atomic, the bulk material being free of seams.

3. The semiconductor device of claim 2, wherein the blocking layer has a nitrogen composition of between about 37.1%-atomic and about 39.93%-atomic.

4. The semiconductor device of claim 3, wherein the blocking layer has a silicon composition of between about 39.3%-atomic and about 42.13%-atomic.

5. The semiconductor device of claim 1, wherein the bulk material has a carbon composition of between about 19.1%-atomic and about 22.13%-atomic.

6. The semiconductor device of claim 5, wherein the bulk material has a nitrogen composition of between about 26.1%-atomic and about 29.13%-atomic.

7. The semiconductor device of claim 6, wherein the bulk material has a silicon composition of between about 45.7%-atomic and about 48.73%-atomic.

8. A semiconductor device comprising:
   a semiconductor fin extending away from a substrate;
   a shallow trench isolation extending away from the semiconductor fin; and
   a hybrid dielectric fin extending away from the shallow trench isolation, the hybrid dielectric fin comprising:
      a blocking layer in physical contact with the shallow trench isolation; and
      a bulk material in physical contact with the blocking layer, the blocking layer surrounding and physically separating each portion of the bulk material from the shallow trench isolation, the bulk material having a carbon concentration greater than the blocking layer, wherein the bulk material extends no further from the substrate than the semiconductor fin.

9. The semiconductor device of claim 8, wherein the blocking layer is silicon carbon nitride.

10. The semiconductor device of claim 9, wherein the bulk material is silicon carbon nitride.

11. The semiconductor device of claim 8, wherein the bulk material has a silicon concentration that is greater than a silicon concentration of the blocking layer.

12. The semiconductor device of claim 8, wherein the bulk material has a nitrogen concentration that is less than a nitrogen concentration of the blocking layer.

13. The semiconductor device of claim 8, wherein the bulk material has a carbon concentration of about 19.1%-atomic.

14. The semiconductor device of claim 8, wherein the bulk material has a carbon composition of between about 19.1%-atomic and about 22.13%-atomic.

15. A semiconductor device comprising:
a semiconductor fin extending through a dielectric material;
a hybrid dielectric fin extending from within the dielectric material, wherein both the hybrid dielectric fin and the semiconductor fin extend away from a substrate a same first distance, the hybrid dielectric fin comprising:
  a blocking layer, the blocking layer comprising a first material with a first composition; and
  a bulk material, the bulk material comprising the first material with a second composition different from the first composition, the second composition having a larger carbon concentration than the first composition; and
a dummy dielectric material in physical contact with the semiconductor fin.

16. The semiconductor device of claim 15, wherein the first material is silicon carbon nitride.

17. The semiconductor device of claim 15, wherein the second composition has a carbon concentration of about 19.1%-atomic.

18. The semiconductor device of claim 15, wherein the second composition has a silicon concentration that is greater than a silicon concentration of the first composition.

19. The semiconductor device of claim 15, wherein the second composition has a nitrogen concentration that is less than a nitrogen concentration of the first composition.

20. The semiconductor device of claim 15, wherein the second composition comprises has a silicon concentration of between about 45.7%-atomic and 48.73%-atomic, a carbon concentration of between about 19.1%-atomic and about 22.13%-atomic, and a nitrogen concentration of between about 26.1%-atomic and about 29.13%-atomic.

* * * * *